US011532535B2

(12) United States Patent
Lin et al.

(10) Patent No.: US 11,532,535 B2
(45) Date of Patent: Dec. 20, 2022

(54) SEMICONDUCTOR DIE PACKAGE WITH THERMAL MANAGEMENT FEATURES AND METHOD FOR FORMING THE SAME

(71) Applicant: Taiwan Semiconductor Manufacturing Company, Ltd., Hsinchu (TW)

(72) Inventors: Yu-Sheng Lin, Zhubei (TW); Po-Yao Lin, Zhudong Township, Hsinchu County (TW); Shu-Shen Yeh, Taoyuan (TW); Chin-Hua Wang, New Taipei (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/230,112

(22) Filed: Apr. 14, 2021

(65) Prior Publication Data

US 2022/0336318 A1     Oct. 20, 2022

(51) Int. Cl.
*H01L 23/367*     (2006.01)
*H01L 23/31*     (2006.01)
(Continued)

(52) U.S. Cl.
CPC ...... *H01L 23/3677* (2013.01); *H01L 21/4882* (2013.01); *H01L 23/31* (2013.01); *H01L 23/373* (2013.01)

(58) Field of Classification Search
CPC . H01L 21/4882; H01L 23/34; H01L 23/3675; H01L 23/3677; H01L 23/373; H01L 23/31; H01L 23/3142
See application file for complete search history.

(56) References Cited

U.S. PATENT DOCUMENTS 10,062,665 B2     8/2018 Chen et al.
2015/0162307 A1*   6/2015 Chen ............... H01L 23/367
                                          438/107

FOREIGN PATENT DOCUMENTS

CN     104716109 A     6/2015
CN     110544687 A     12/2019
TW     200810031 A     2/2008

OTHER PUBLICATIONS

Chinese Language Office Action of corresponding TW application 11120238230 dated Mar. 9, 2022.

* cited by examiner

*Primary Examiner* — Thanhha S Pham
(74) *Attorney, Agent, or Firm* — McClure, Qualey & Rodack, LLP

(57) ABSTRACT

A semiconductor die package and a method of forming the same are provided. The semiconductor die package includes a package substrate, and a first semiconductor die and a second semiconductor die disposed thereon. A ring structure is attached to the package substrate and surrounds the semiconductor dies. A lid structure is attached to the ring structure and disposed over the semiconductor dies, and has an opening exposing the second semiconductor die. A heat sink is disposed over the lid structure and has a portion extending into the opening of the lid structure. A first thermal interface material (TIM) layer is interposed between the lid structure and the first semiconductor die. A second TIM layer is interposed between the extending portion of the heat sink and the second semiconductor die. The first TIM layer has a thermal conductivity higher than the thermal conductivity of the second TIM layer.

20 Claims, 17 Drawing Sheets

(51) Int. Cl.
*H01L 23/373* (2006.01)
*H01L 21/48* (2006.01)

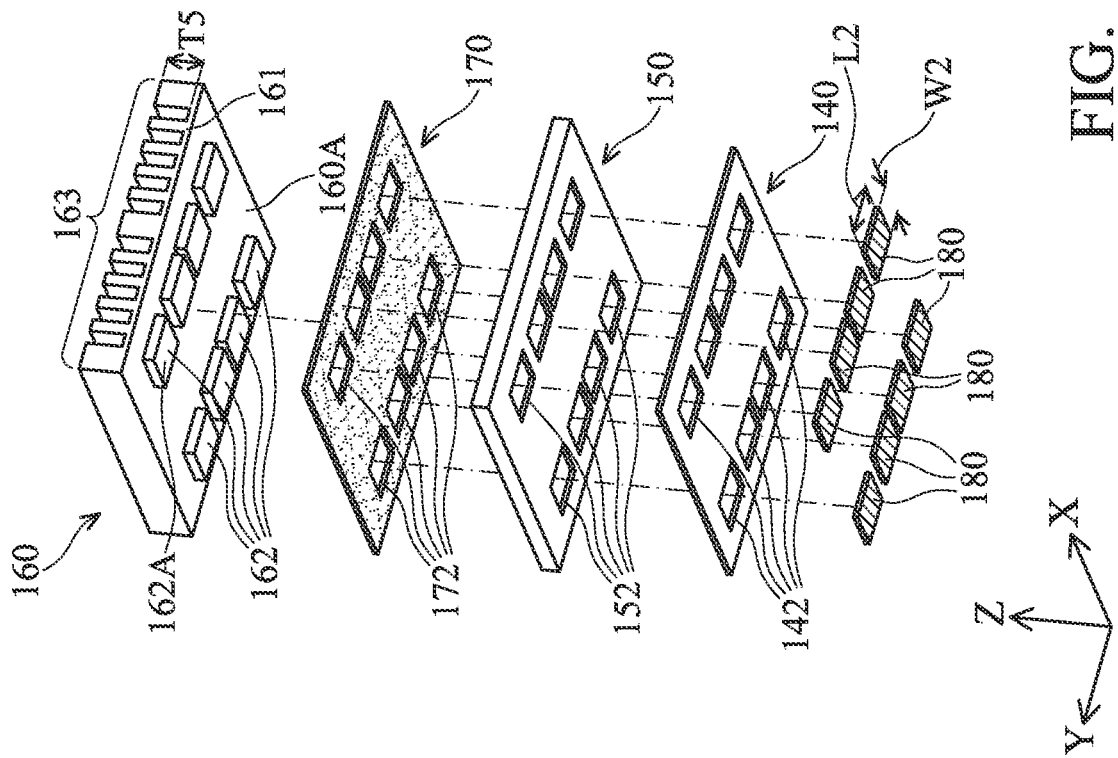
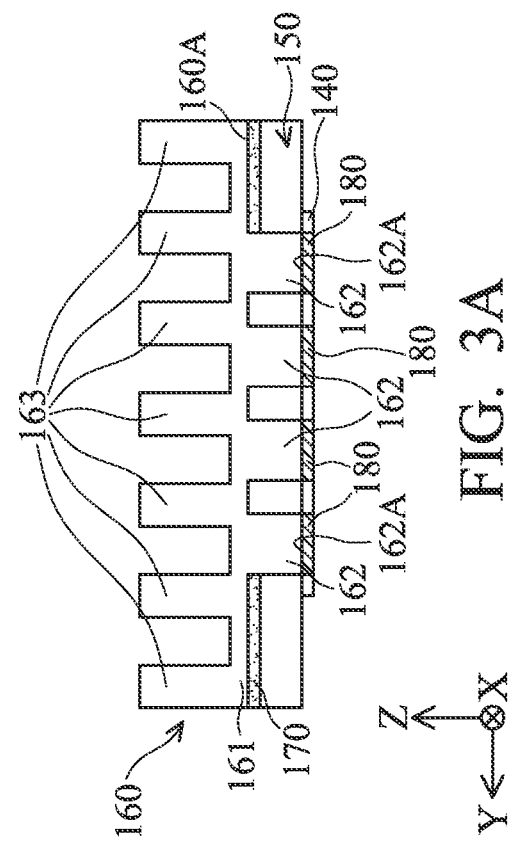
FIG. 3A
FIG. 3B

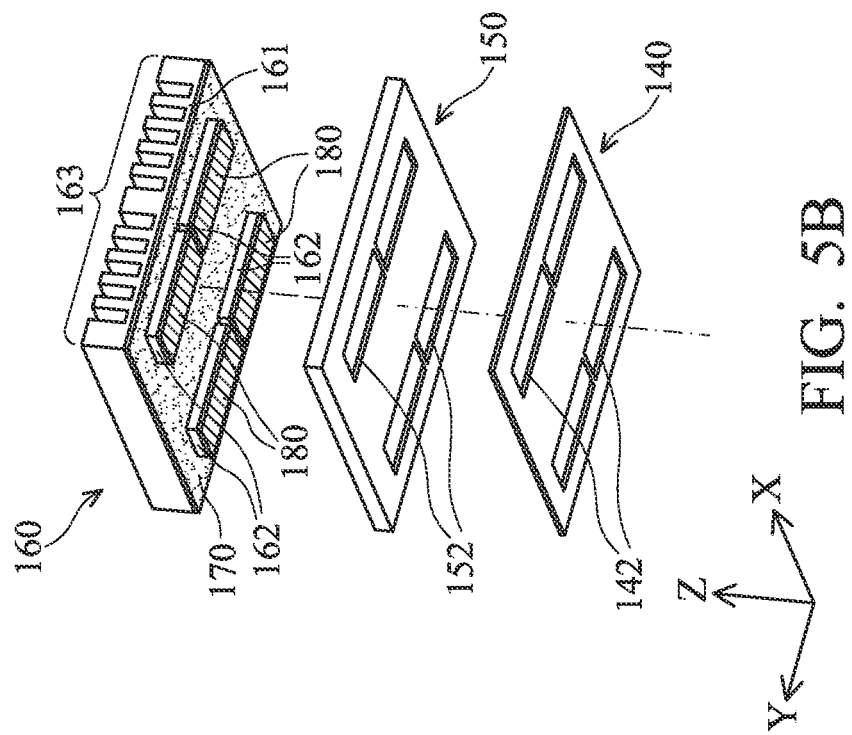
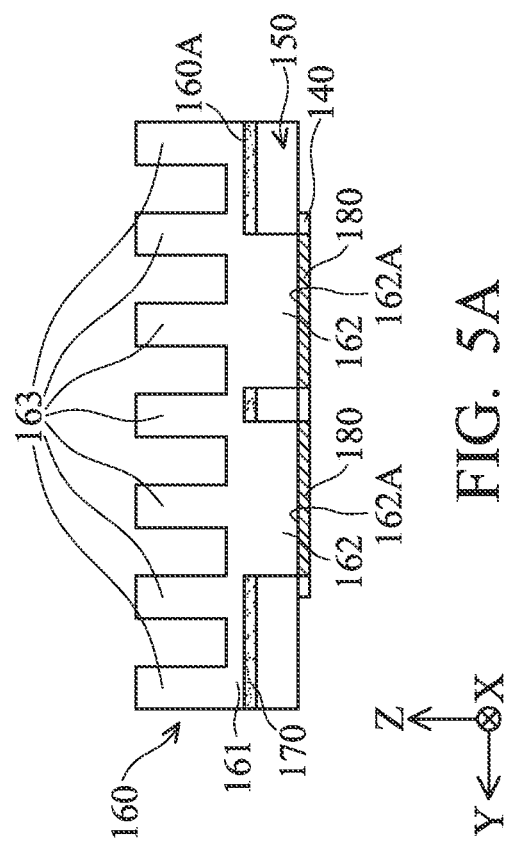

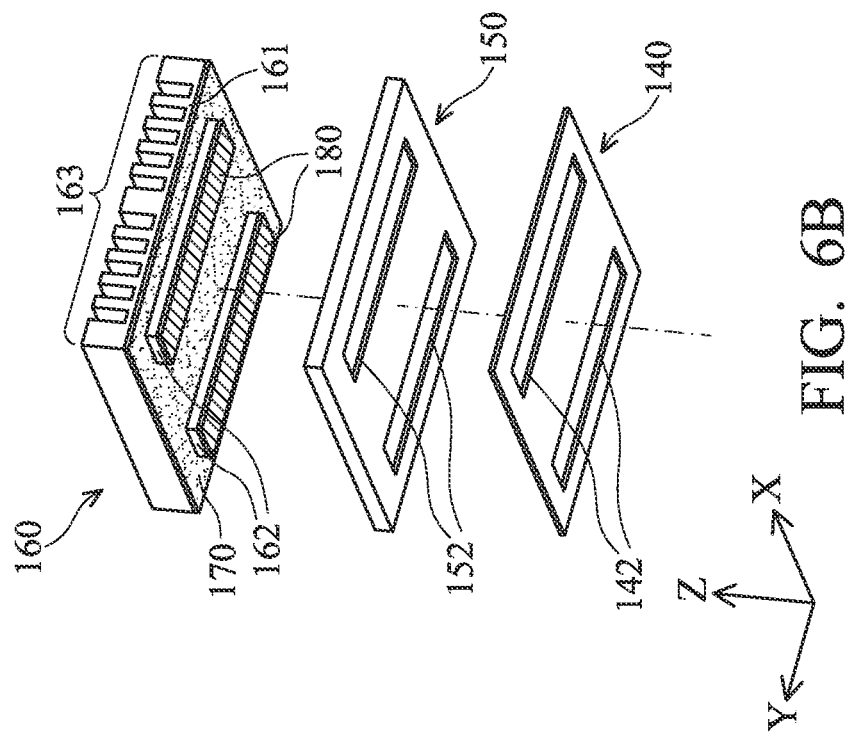
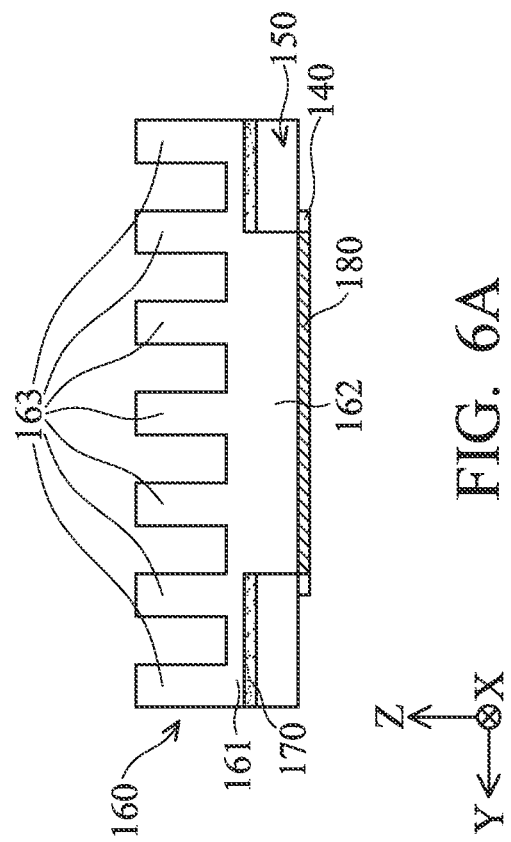
FIG. 6B
FIG. 6A

SEMICONDUCTOR DIE PACKAGE WITH THERMAL MANAGEMENT FEATURES AND METHOD FOR FORMING THE SAME

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductor layers over a semiconductor substrate, and patterning the various material layers using lithography and etching processes to form circuit components and elements thereon. Many integrated circuits (ICs) are typically manufactured on a single semiconductor wafer, and individual dies on the wafer are singulated by sawing between the integrated circuits along a scribe line. The individual dies are typically packaged separately, in multi-chip modules, for example, or in other types of packaging.

A package not only provides protection for semiconductor devices from environmental contaminants, but also provides a connection interface for the semiconductor devices packaged therein. One smaller type of packaging for semiconductors is a flip chip chip-scale package (FcCSP), in which a semiconductor die is placed upside-down on a substrate and bonded to the substrate using bumps. The substrate has wiring routed to connect the bumps on the die to contact pads on the substrate that have a larger footprint. An array of solder balls is formed on the opposite side of the substrate and is used to electrically connect the packaged die to an end application.

Although existing packaging structures and methods for fabricating semiconductor die package structure have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1F-1 is a schematic cross-sectional view of a stage of a process for forming a semiconductor die package in accordance with some other embodiments, wherein the TIM layer 140 is only provided on the first semiconductor die 110 and is a continuous structure without openings formed therein.

FIG. 1F-2 is a schematic cross-sectional view of a stage of a process for forming a semiconductor die package in accordance with some other embodiments, wherein the lid structure 150 and the ring structure 130 are one-piece, and such one-piece structure is attached to the package substrate 120 in a single step using the adhesive layer 132.

FIG. 1H-1 is a schematic cross-sectional view of a semiconductor die package in accordance with some other embodiments, wherein the thickness of TIM layer 180 is less than the thickness of TIM layer 140.

FIG. 2 is a schematic top view of a portion of a semiconductor die package in accordance with some embodiments, wherein the lid structure and the heat sink are not shown.

FIG. 3A is a cross-sectional view of a portion of a semiconductor die package in accordance with some embodiments.

FIG. 3B is an exploded view of a portion of a semiconductor die package in accordance with some embodiments

FIG. 5A is a cross-sectional view of a portion of a semiconductor die package in accordance with some other embodiments.

FIG. 5B is an exploded view of a portion of a semiconductor die package in accordance with some other embodiments FIG. 6A is a schematic cross-sectional view of a portion of a semiconductor die package in accordance with some other embodiments.

FIG. 6B is an exploded view of a portion of a semiconductor die package in accordance with some embodiments.

DETAILED DESCRIPTION

Figure 1A:
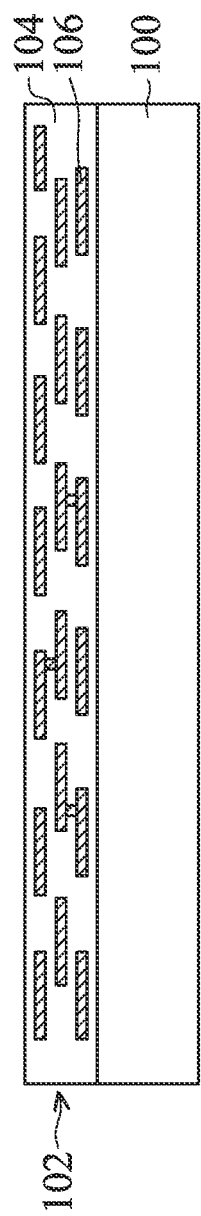
FIGS. 1A-1H are schematic cross-sectional views of various stages of a process for forming a semiconductor die package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x ±5 or 10%.

A semiconductor die package and the method for forming the same are provided in accordance with various embodiments. Some variations of some embodiments are discussed. Throughout the various views and illustrative embodiments, like reference numbers are used to designate like elements.

In accordance with some embodiments of the present disclosure, a semiconductor die package includes a heat sink disposed above a lid structure to dissipate heat. The lid structure is attached to a high-power consuming die in the semiconductor die package through a first thermal interface material (TIM) layer. The heat sink has a protrusion that passes through an opening of the lid structure and is attached to a low-power consuming die in the semiconductor die package through a second TIM layer. The heat transfer of the low-power consuming die can be improved by the heat sink protrusion and the second TIM layer, which will be further described later. In some embodiments, the first TIM layer utilizes metallic-based or solder-based TIM, and the second TIM layer utilizes polymer TIM instead of metallic-based or solder-based TIM. Therefore, there is no need to perform an additional backside metallization (BSM) process on the backside of the low-power consuming die to facilitate bonding with the second TIM layer (polymer TIM), so costs can be reduced. Further, since polymer TIM has a good adhering ability, the risk of delamination of the second TIM layer can also be reduced, thereby improving the reliability of the entire package structure.

Embodiments will be described with respect to a specific context, namely a packaging technique with an interposer substrate or other active chip in a two and a half dimensional integrated circuit (2.5DIC) structure or a three dimensional IC (3DIC) structure. Embodiments discussed herein are to provide examples to enable making or using the subject matter of this disclosure, and a person having ordinary skill in the art will readily understand modifications that can be made while remaining within contemplated scopes of different embodiments. Although method embodiments may be discussed below as being performed in a particular order, other method embodiments contemplate steps that are performed in any logical order.

FIGS. 1A-1H are schematic cross-sectional views of various stages of a process for forming a semiconductor die package in accordance with some embodiments. As shown in FIG. 1A, an interposer substrate 102 is formed over a carrier substrate 100, in accordance with some embodiments. The carrier substrate 100 is used to provide temporary mechanical and structural support for the processing of build-up layers or structures during subsequent processing steps. The carrier substrate 100 may be a glass substrate, semiconductor substrate, or another suitable substrate. The interposer substrate 102 is used to provide electrical connection between semiconductor devices or components packaged thereon and a package substrate (which will be described later), after the carrier substrate 100 is removed at a subsequent stage illustrated in FIG. 1C.

In some embodiments, the interposer substrate 102 is an interposer wafer, which is free from active devices (such as transistors and diodes) and passive devices (such as resistors, capacitors, inductors, or the like). In some alternative embodiments, the interposer substrate 102 is a device wafer including active and/or passive devices thereon or therein.

In some embodiments, the interposer substrate 102 is a dielectric substrate, which includes a redistribution line (RDL) structure. As shown in FIG. 1A, the RDL structure includes multiple laminated insulating layers 104 and multiple conductive features 106 surrounded by the insulating layers 104. The conductive features 106 may include conductive lines, conductive vias, and/or conductive pads. In some embodiments, some of the conductive vias are stacked with each other. The upper conductive via is substantially aligned with the lower conductive via so as to have a shorter routing length. However, some of the conductive vias may be staggered vias in some cases with restricted routing. The upper conductive via is misaligned with the lower conductive via.

The insulating layers 104 may be made of or include one or more polymer materials. The polymer material(s) may include polybenzoxazole (PBO), polyimide (PI), epoxy-based resin, one or more other suitable polymer materials, or a combination thereof. In some embodiments, the polymer material is photosensitive. A photolithography process may therefore be used to form openings with desired patterns in the insulating layers 104.

In some other embodiments, some or all of the insulating layers 104 are made of or include dielectric materials other than polymer materials. The dielectric material may include silicon oxide, silicon carbide, silicon nitride, silicon oxynitride, one or more other suitable materials, or a combination thereof.

The conductive features 106 may include conductive lines providing electrical connection in horizontal directions and conductive vias providing electrical connection in vertical directions. The conductive features 106 may be made of or include copper, aluminum, gold, cobalt, titanium, nickel, silver, graphene, one or more other suitable conductive materials, or a combination thereof. In some embodiments, the conductive features 106 include multiple sub-layers. For example, each of the conductive features 106 contains multiple sub-layers including Ti/Cu, Ti/Ni/Cu, Ti/Cu/Ti, Al/Ti/Ni/Ag, other suitable sub-layers, or a combination thereof.

The formation of the above RDL structure (i.e., interposer substrate 102) may involve multiple deposition or coating processes, multiple patterning processes, and/or multiple planarization processes.

The deposition or coating processes may be used to form insulating layers and/or conductive layers. The deposition or coating processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, one or more other applicable processes, or a combination thereof.

In some alternative embodiments (not shown), the interposer substrate 102 may be a semiconductor substrate, which may be a bulk semiconductor substrate, a silicon-on-insulator (SOI) substrate, a multi-layered semiconductor substrate, or the like. The semiconductor material of the interposer substrate 102 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The interposer substrate 102 may be doped or undoped.

In some embodiments, through-vias (TVs) are formed in and penetrating through the semiconductor substrate, in order to provide electrical connection between devices mounted on opposite sides of the interposer substrate 102. The processes for forming the through-vias are well known in the art and therefore not described herein. In some further embodiments, one or more interconnect structure layers (similar to the RDL structure of interposer substrate 102 shown in FIG. 1A) may be formed on one or both sides of the semiconductor substrate of interposer substrate 102 for routing.

Figure 1B:
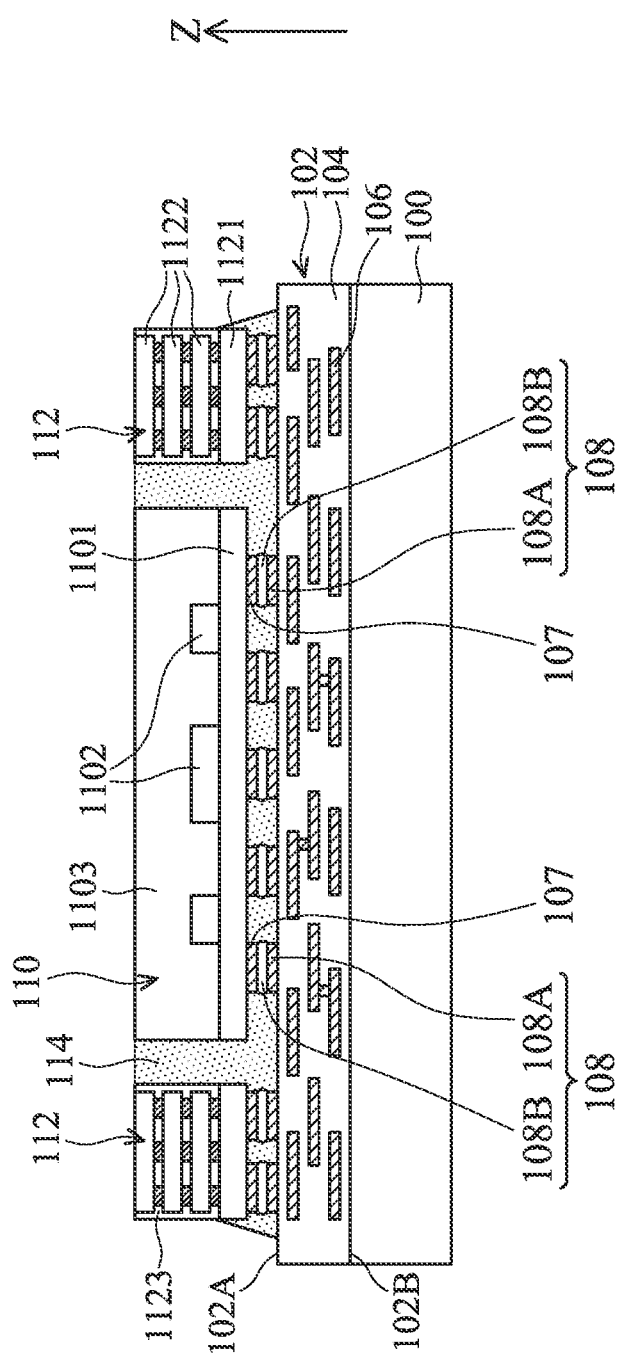

As shown in FIG. 1B, semiconductor dies 110 and semiconductor dies 112 (for illustration, only one semiconductor die 110 and two semiconductor dies 112 are shown) are disposed over the interposer substrate 102, in accordance with some embodiments. The semiconductor dies 110 and 112 may be placed over a first surface 102A (e.g., the upper surface shown in FIG. 1B) of the interposer substrate 102 using, for example, a pick-and-place tool. In some embodiments, in the top view of a package structure, one semiconductor die 110 is disposed between two semiconductor dies 112, as shown in FIG. 2.

Figure 1C:
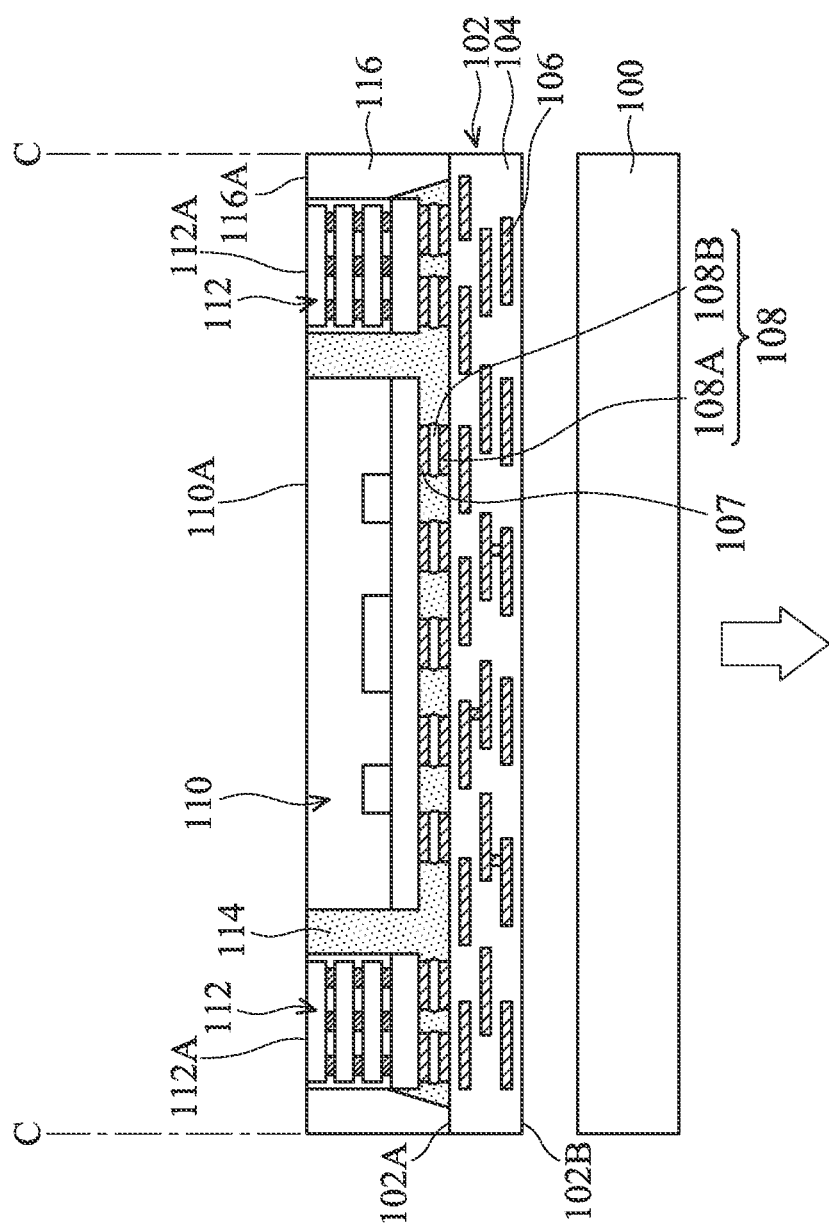
Figure 1D:
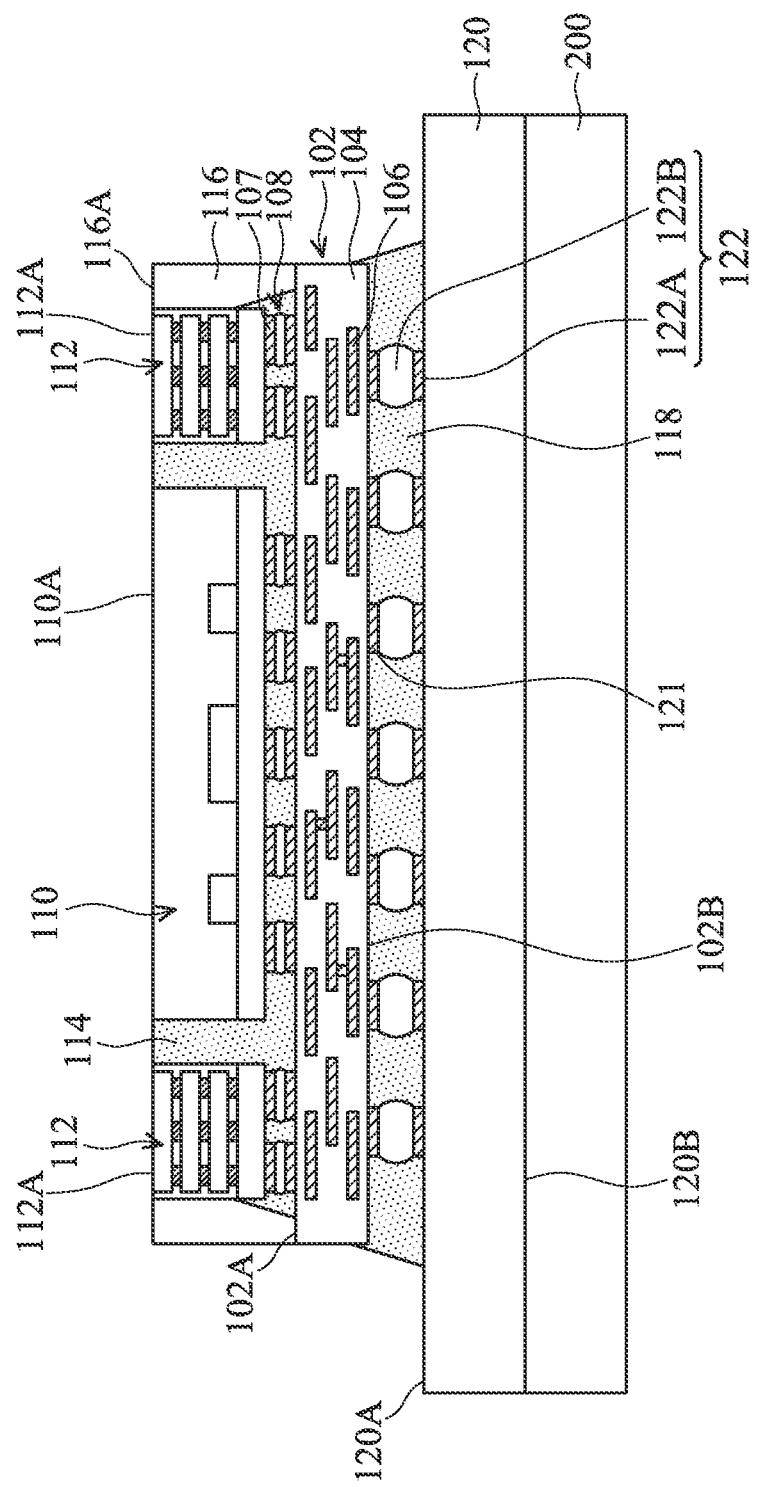
Figure 1E:
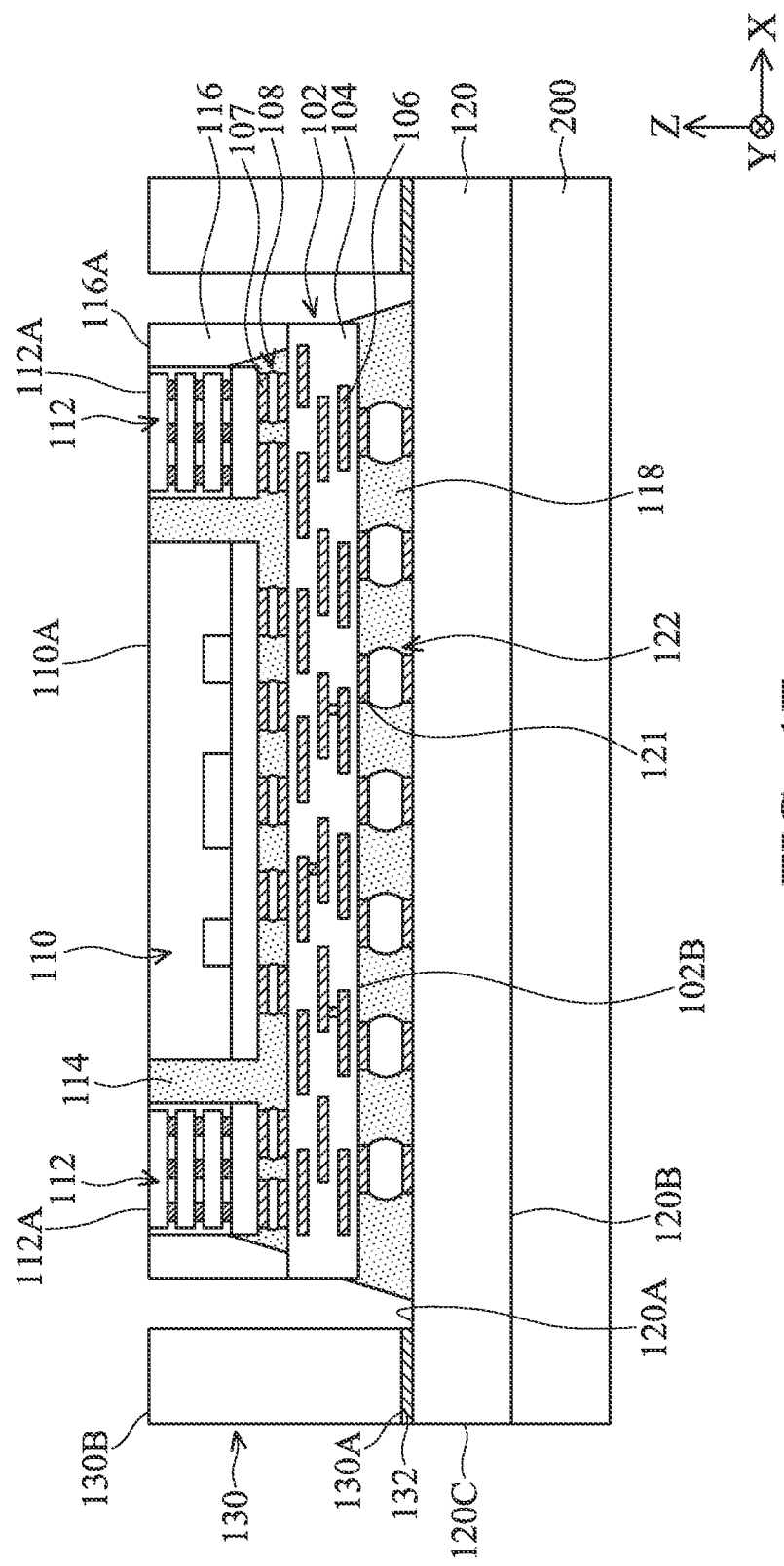
Figure 1F:
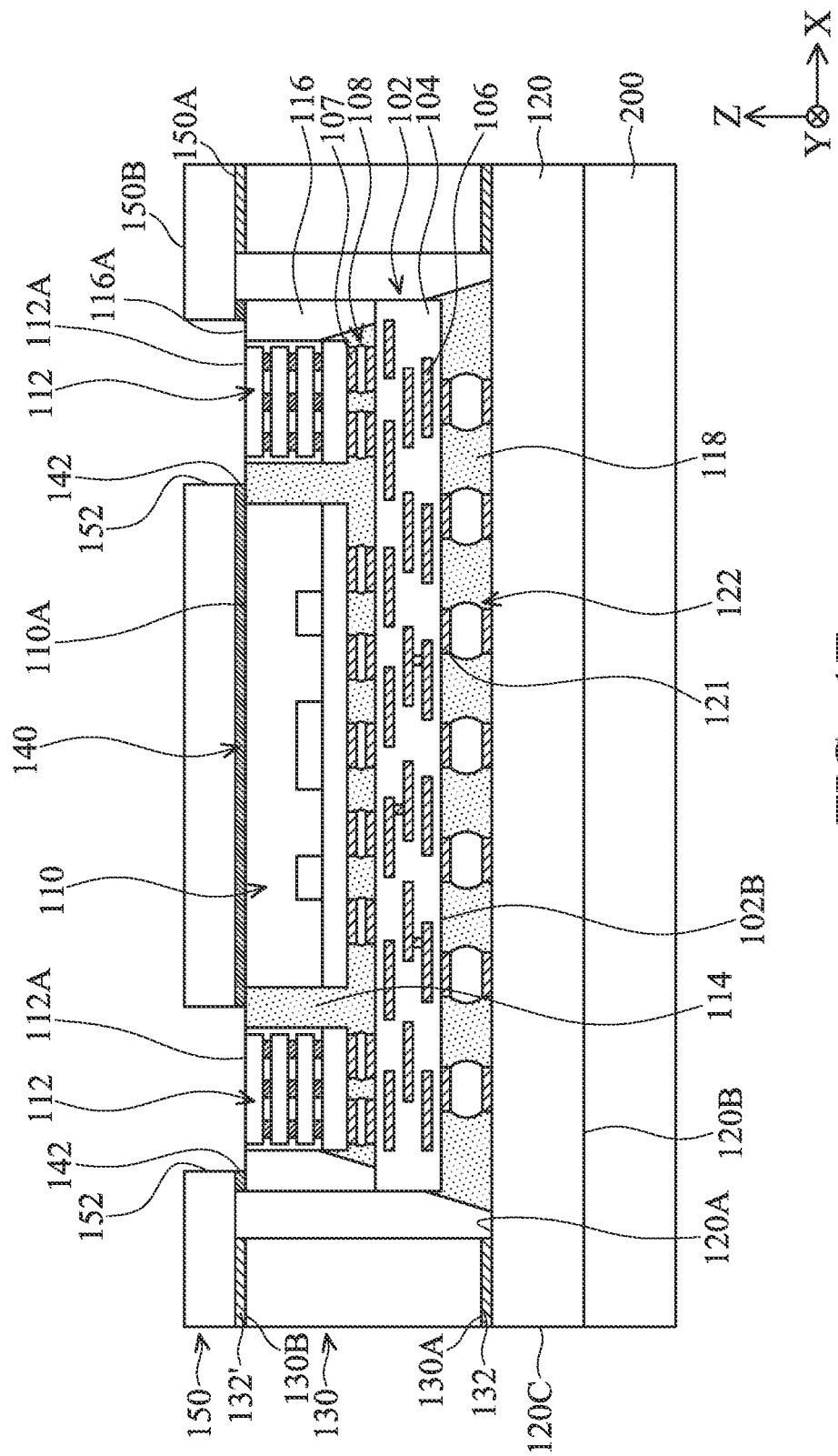
Figures 1, 1F:
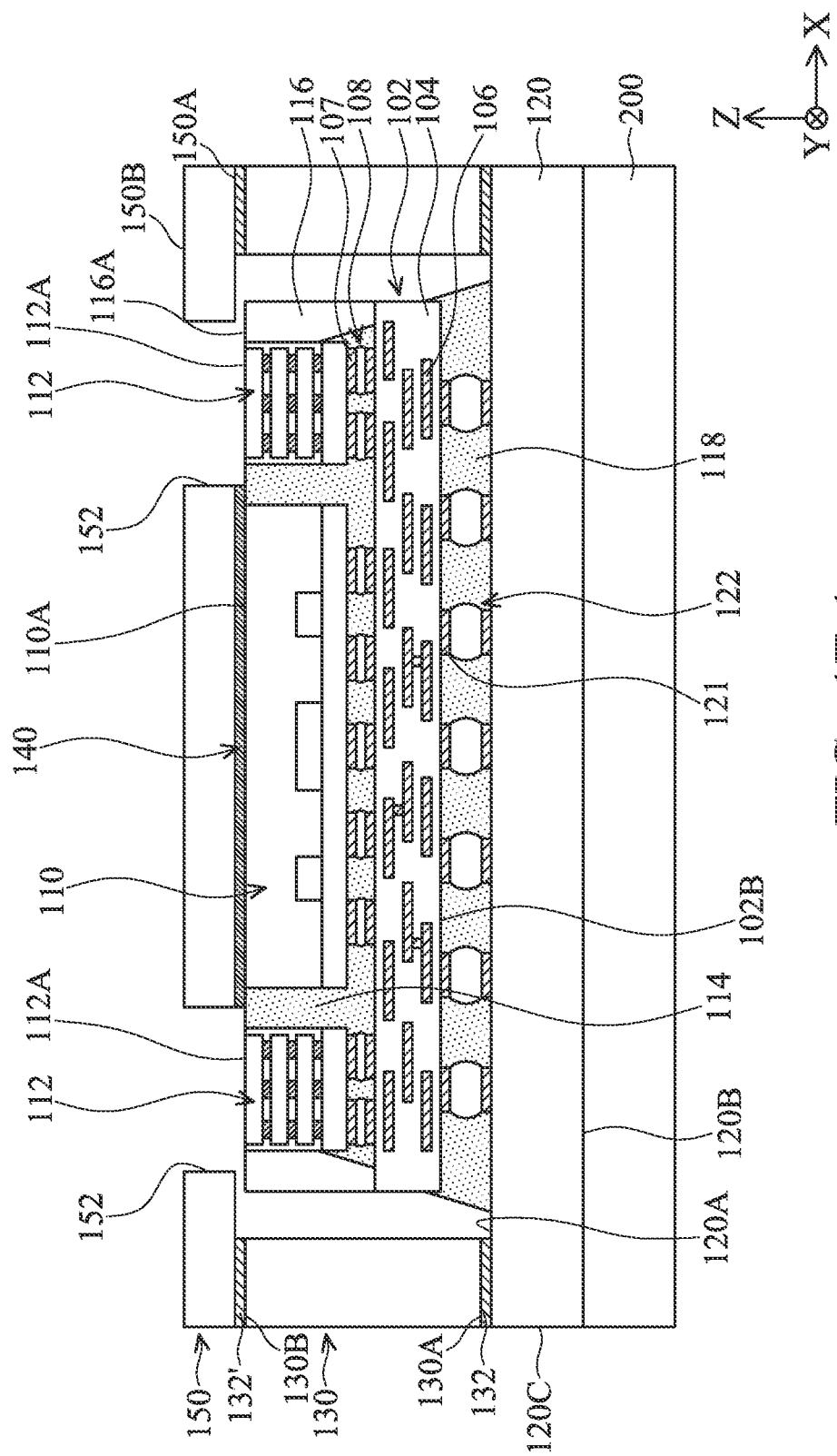
Figures 1, 1F, 2:
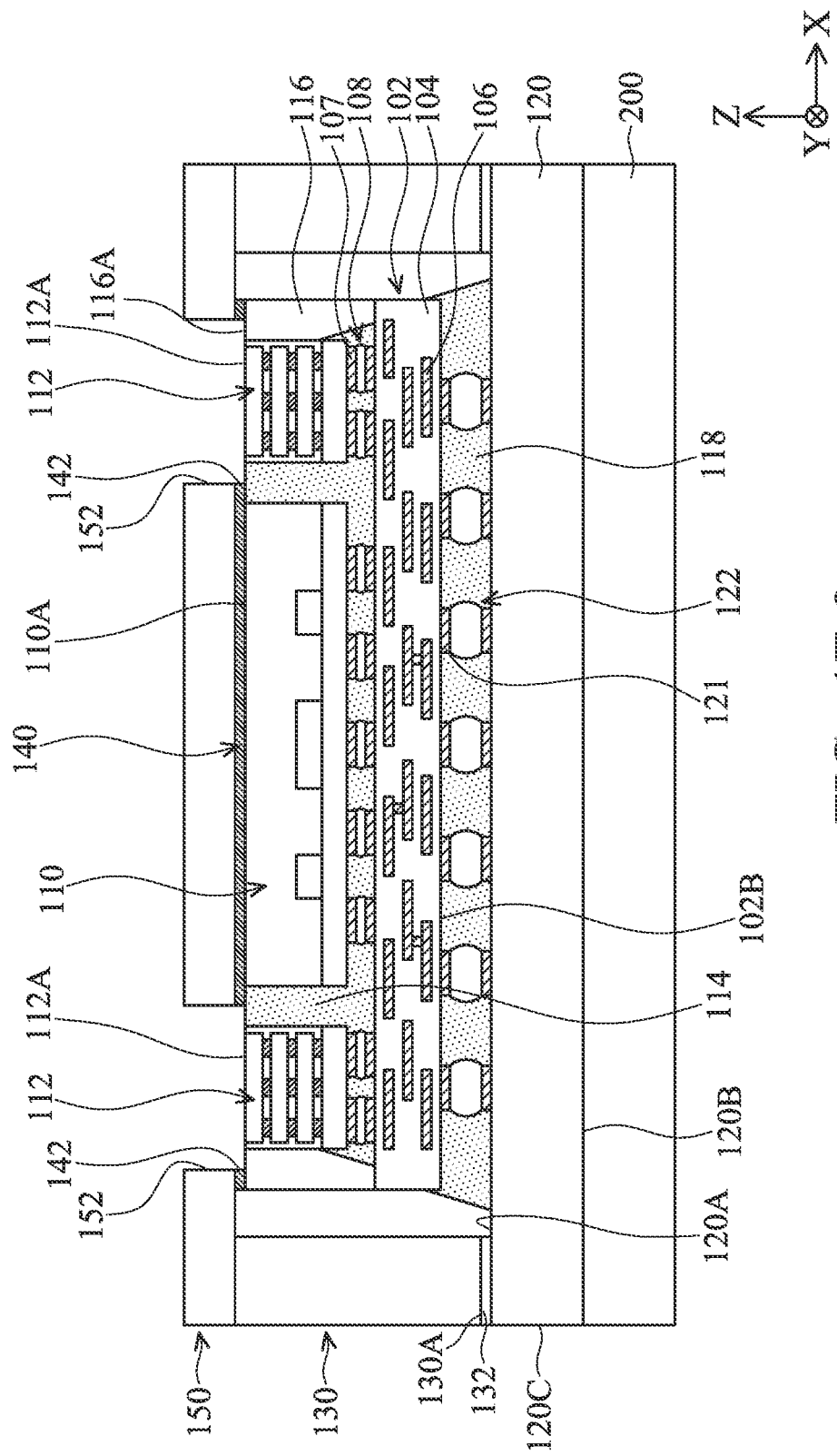

FIG. 2 is a top view of a portion of a package structure in accordance with some embodiments, showing the arrangement of the semiconductor dies 110 and 112 (for example, multiple semiconductor dies 112 are arranged on opposite sides of the semiconductor die 110). However, the disclosure is not limited to the embodiments shown in FIG. 2, and other configurations and any number of semiconductor dies 110 and 112 can be used in different embodiments. The semiconductor dies 110 and 112 are each generally rectangular or square in the top view, but the disclosure is not limited thereto.

In some embodiments, the semiconductor dies 110 (also referred to as first semiconductor dies 110 herein) and the semiconductor dies 112 (also referred to as second semiconductor dies 112 herein) are different types of electronic devices that provide different functions. In some embodiments, the first semiconductor die 110 is a high-power consuming die and may consume a relatively high amount of power, and therefore generate a relatively large amount of heat, compared to the second semiconductor die 112 (thus also referred to as a low-power consuming die). For example, the first semiconductor die 110 may consume between about 50 W and about 100 W of power, whereas the second semiconductor die 112 may consume between about 5 W and about 10 W of power.

In some embodiments, the first semiconductor die 110 may be a single System on a Chip (SoC) die, multiple SoC stacked dies, or the like. For example, FIG. 1B illustrates that the first semiconductor die 110 is a SoC die, which includes a semiconductor substrate 1101, and multiple different electronic components 1102 (such as active components and/or passive components) mounted on the semiconductor substrate 1101. The electronic components 1102 may be electrically connected through the semiconductor substrate 1101 to form a functional integrated circuit, such as a processor, logic circuitry, memory, analog circuit, digital circuit, mixed signal circuit, or the like. A protective layer 1103 made of molding material (such as an epoxy-based resin) may be disposed on the semiconductor substrate 1101 to surround and protect the overlying electronic components 1102, in accordance with some embodiments.

In some embodiments, the second semiconductor die 112 may be a single memory die or a memory die stack. For example, FIG. 1B illustrates that the second semiconductor die 112 is a memory die stack, which includes multiple stacked memory dies 1122 bonded to a logic die 1121 (sometimes called a base die). Each of the memory dies 1122 may include a static random access memory (SRAM) device, a dynamic random access memory (DRAM) device, a high bandwidth memory (HBM) device, or another type of memory device. A protective layer 1123 made of molding material (such as an epoxy-based resin) may also be formed to surround and protect the logic die 1121 and the memory dies 1122, in accordance with some embodiments.

Each of the semiconductor dies 110 and 112 can be obtained, for example, by sawing or dicing a semiconductor wafer (with several IC dies formed thereon) along scribed lines to separate the semiconductor wafer into a plurality of individual semiconductor dies. It should be appreciated that the above examples of semiconductor dies 110 and 112 are provided for illustrative purposes, and other semiconductor dies or chips having other functions may also be used in some alternative embodiments.

In various embodiments, the semiconductor dies 110 and 112 may have the same or different heights in a vertical direction (e.g., the direction Z shown in FIG. 1), and/or the same or different sizes in a horizontal cross section perpendicular to the vertical direction.

After disposing the semiconductor dies 110 and 112 over the interposer substrate 102, they are bonded to the interposer substrate 102 through flip-chip bonding by way of conductive elements 107 on each semiconductor die 110/112 and conductive structures 108 on the interposer substrate 102 to form conductive joints, as shown in FIG. 1B, in accordance with some embodiments.

In some embodiments, the conductive elements 107, such as conductive pillars, may be formed on an active side (e.g., the lower surface shown in FIG. 1B) of each semiconductor die 110/112 at the exposed contact pads (not shown) before the bonding process. The conductive elements 107 may be made of or include copper, aluminum, gold, cobalt, titanium, tin, one or more other suitable materials, or a combination thereof. The conductive elements 107 may be formed using an electroplating process, an electroless plating process, a placement process, a printing process, a physical vapor deposition (PVD) process, a chemical vapor deposition (CVD) process, one or more other applicable processes, or a combination thereof.

In some embodiments, each of the conductive structures 108 includes a metal pillar 108A and a metal cap layer (such as a solder cap) 108B over the metal pillar 108A, as shown in FIG. 1B. The conductive structures 108 including the metal pillars 108A and the metal cap layers 108B are sometimes referred to as micro bumps. The conductive structures 108 may be formed on the first surface 102A of the interposer substrate 102 at the exposed contact pads (not shown) before the bonding process.

The metal pillars 108A may include a conductive material such as copper, aluminum, gold, nickel, palladium, the like, or a combination thereof, and may be formed by sputtering, printing, electroplating, electroless plating, CVD, or the like. The metal pillars 108A may be solder-free and have substantially vertical sidewalls. In accordance with some embodiments, a metal cap layer 108B is formed on the top of a metal pillar 108A. The metal cap layers 108B may include nickel, tin, tin-lead, gold, copper, silver, palladium, indium, nickel-palladium-gold, nickel-gold, the like, or a combination thereof, and may be formed by a plating process such as an electroplating process. One of ordinary skill in the art would appreciate that the above conductive structures 108 examples are provided for illustrative purposes, and other structures of the conductive structures 108 may also be used.

The bonding between the semiconductor dies 110 and 112 and the interposer substrate 102 may be solder bonding or direct metal-to-metal (such as a copper-to-copper) bonding, in accordance with some embodiments. In some embodiments, the semiconductor dies 110 and 112 are bonded to the interposer substrate 102 through a reflow process. During the reflow, the conductive joints (i.e., the conductive elements 107 and the conductive structures 108) are in contact with the exposed contact pads of the semiconductor dies 110 and 112 and the exposed contact pads (constructed by some conductive features 106) of the interposer substrate 102, respectively, to physically and electrically couple the semiconductor dies 110 and 112 to the interposer substrate 102.

In some embodiments, an underfill element 114 is further formed over the interposer substrate 102 to surround and protect the conductive joints, and enhances the connection between the semiconductor dies 110 and 112 and the interposer substrate 102, as shown in FIG. 1B. The underfill element 114 may be made of or include an insulating material such as an underfill material. The underfill material may include an epoxy, a resin, a filler material, a stress release agent (SRA), an adhesion promoter, another suitable material, or a combination thereof. In some embodiments, an underfill material in liquid state is dispensed into the gap between each semiconductor die 110/112 and the interposer substrate 102 to reinforce the strength of the conductive joints and therefore the overall package structure. After the dispensing, the underfill material is cured to form the underfill element 114.

In some embodiments, the underfill element 114 fills the whole gap between each semiconductor die 110/112 and the interposer substrate 102, as shown in FIG. 1B. Also, a portion of the underfill element 114 is in the gaps between adjacent semiconductor dies 110 and 112. The underfill element 114 exists but is not shown in FIG. 2.

As shown in FIG. 1C, an encapsulant layer 116 is further formed over the interposer substrate 102 to surround and protect the semiconductor dies 110 and 112 and the underfill element 114. The encapsulant layer 116 may be separated from the conductive joints below the semiconductor dies 110 and 112 by the underfill element 114. In some embodiments, the encapsulant layer 116 is made of or includes an insulating material such as a molding material. The molding material may include a polymer material, such as an epoxy-based resin with fillers dispersed therein. In some embodiments, a molding material (such as a liquid molding material) is dispensed over the interposer substrate 102 and/or over the semiconductor dies 110 and 112. In some embodiments, a thermal process is then used to cure the liquid molding material and to transform it into the encapsulant layer 116.

In some embodiments, a planarization process (not shown) is also applied on the encapsulant layer 116 to partially remove the encapsulant layer 116, until the backside (e.g., the top surface 110A shown in FIG. 1C) of each (first) semiconductor die 110 and the backside (e.g., the top surface 112A shown in FIG. 1C) of each (second) semiconductor die 112 are exposed through the top surface 116A of the encapsulant layer 116. This facilitates the dissipation of heat generated from the semiconductor dies 110 and 112 during operation. The planarization process may include a grinding process, a chemical mechanical polishing (CMP) process, an etching process, a dry polishing process, one or more other applicable processes, or a combination thereof. The encapsulant layer 116 exists but is not shown in FIG. 2.

Afterwards, the carrier substrate 100 is removed to expose a second surface 102B (e.g., the shown lower surface) of the interposer substrate 102, as shown in FIG. 1C, in accordance with some embodiments. Although not shown, the remaining structure may be turned upside down and placed so that the semiconductor die side is affixed to a dicing tape (not shown). A singulation process (also referred to as a saw process) is then performed along cutting grooves C shown in FIG. 1C, to form multiple separate package structures, in accordance with some embodiments. In FIG. 1C, one of the package structures is shown, which includes an interposer substrate 102 with semiconductor dies 110 and 112, an underfill element 114 and an encapsulant layer 116 thereon. Afterwards, each package structure may be removed from the dicing tape (not shown) using, for example, a pick-and-place tool (not shown).

As shown in FIG. 1D, the resulting package structure (hereinafter also referred to as a semiconductor device) in FIG. 1C is disposed (by a pick-and-place tool, for example) over a package substrate 120 placed on another carrier substrate 200 (similar to the carrier substrate 100 mentioned above) with the second surface 102B (e.g., the shown lower surface) of the interposer substrate 102 facing a first surface 120A (e.g., the shown upper surface) of the package substrate 120, in accordance with some embodiments. The package substrate 120 is used to provide electrical connection between semiconductor devices or components packaged in the package structure and an external electronic device, after the carrier substrate 200 is removed at a subsequent stage (illustrated in FIG. 1H) which will be further described later.

In some embodiments, after stacking the interposer substrate 102 over the package substrate 120, it is bonded to the package substrate 120 through flip-chip bonding by way of conductive elements 121 (such as conductive pillars) formed on the second surface 102B of the interposer substrate 102 at the exposed contact pads (not shown) and conductive structures 122 (such as micro bumps each including a metal pillar 122A and a metal cap layer 122B over the metal pillar 122A) formed on the first surface 120A of the package substrate 120 at the exposed contact pads (not shown) to form conductive joints, as shown in FIG. 1D. The bonding between the interposer substrate 102 and the package substrate 120 may be solder bonding or direct metal-to-metal (such as a copper-to-copper) bonding. In some embodiments, the interposer substrate 102 is bonded to the package substrate 120 through a reflow process, as previously discussed. The materials and formation method of the conductive elements 121 and the conductive structures 122 may be the same or similar to those of the conductive elements 107 and the conductive structures 108, respectively, illustrated in FIG. 1B, and are not repeated here.

The conductive joints (i.e., conductive elements 121 and the conductive structures 122) enable electrical connection between the interposer substrate 102 (as well as devices thereon) and the package substrate 120. In some embodiments, an underfill element 118 is formed over the package substrate 120 to surround and protect the conductive joints, and enhances the connection between the interposer substrate 102 and the package substrate 120, as shown in FIG. 1D. The materials and formation method of the underfill element 118 may be the same or similar to those of the underfill element 114 illustrated in FIG. 1B, and are not repeated here. The underfill element 118 exists but is not shown in FIG. 2.

As shown in FIG. 1E, a ring structure 130 is mounted on the package substrate 120, in accordance with some embodiments. The ring structure 130 may be placed over the package substrate 120 using, for example, a pick-and-place tool. The ring structure 130 may have a rigidity greater than that of the package substrate 120, and is configured as a stiffener ring for constraining the package substrate 120 to alleviate its warpage and/or to enhance robustness of the package substrate 120.

The ring structure 130 may have a substantially rectangular or square ring shape in the top view (see FIG. 2), depending on the shape of the package substrate 120. In some embodiments, the ring structure 130 is arranged along the periphery 120C of the package substrate 120, and a gap is formed between the inner edge of the ring structure 130 and the periphery of the interposer substrate 102. In some embodiments, the ring structure 130 is arranged to surround the interposer substrate 102 and the semiconductor dies 110 and 112 thereon. The ring structure 130 is basically a flat structure, and may have a bottom surface 130A facing the first surface 120A of the package substrate 120 and a top surface 130B opposite the bottom surface 130A.

The material of the ring structure 130 may include metal such as Cu, stainless steel, stainless steel/Ni, or the like, but is not limited thereto. In some embodiments, the material of the ring structure 130 is selected so that the coefficient of thermal expansion (CTE) of the ring structure 130 is similar to that of the package substrate 120 to reduce CTE mismatch therebetween, thereby reducing stress (as well as deformation) on the package substrate 120 caused by the ring structure 130.

In some embodiments, the ring structure 130 is attached to the first surface 120A of the package substrate 120 using a non-conductive adhesive layer 132. The adhesive layer 132 may be any suitable adhesive, epoxy, die attach film (DAF), or the like. The adhesive layer 132 may be applied to the bottom surface 130A of the ring structure 130 or may be applied over the first surface 120A of the package substrate 120, before the installation of the ring structure 130, in accordance with some embodiments.

The following will describe the installation of the thermal management feature of the package structure in conjunction with FIGS. 1F-1G and FIGS. 3A-3B. FIGS. 3A and 3B are respectively a cross-sectional view and an exploded view of a portion (i.e., the thermal management feature, which includes a heat dissipating lid structure, a heat sink, and various thermal interface material (TIM) layers) of a semiconductor die package in accordance with some embodiments.

As shown in FIG. 1F, a lid structure 150 is mounted on the ring structure 130 and extends over the semiconductor dies 110 and 112, in accordance with some embodiments. The lid structure 150 may be placed over the ring structure 130 and the semiconductor dies 110 and 112 using, for example, a pick-and-place tool. The lid structure 150 may have a high thermal conductivity (Tk), for example, between about 200 W/m·K to about 400 W/m·K or more, and may be configured as a heat spreader for dispersing heat generated from devices in the package structure.

The lid structure 150 may have a substantially rectangular or square shape depending on the shape of the package substrate 120. In some embodiments, the lid structure 150 is a planar structure and has surfaces 150A and 150B opposite to each other. The (bottom) surface 150A faces the ring structure 130 and the semiconductor dies 110 and 112. In some embodiments, the lid structure 150 further has openings 152 penetrating the surfaces 150A and 150B. After the installation of the lid structure 150, the openings 152 are aligned with the second semiconductor dies 112, respectively, as shown in FIG. 1F. The openings 152 may be formed by mechanical drilling (such as laser drilling) or other suitable processes. The function of the openings 152 exposing the second semiconductor dies 112 will be described later.

The lid structure 150 may be formed using a metal, a metal alloy, or the like. For example, the material of lid structure 150 may include metals and/or metal alloys such as Al, Cu, Ni, Co, the like, or a combination thereof. In some embodiments, the lid structure 150 is formed of substantially similar materials as the ring structure 130, but the disclosure is not limited thereto.

In some embodiments, as shown in FIG. 1F, the lid structure 150 is attached to the top surface 130B of the ring structure 130 using an adhesive layer 132' (similar to the adhesive layer 132 mentioned above), and is attached to top surface 110A of the first semiconductor die 110 using a thermal interface material (TIM) layer 140. The adhesive layer 132' may be arranged along the top surface 130B of the ring structure 130, in accordance with some embodiments. The adhesive layer 132' may be applied to the top surface 130B of the ring structure 130 or may be applied over the bottom surface 150A of the lid structure 150, and the TIM layer 140 may be applied to the top surface 110A of the first semiconductor die 110 or may be applied over the bottom surface 150A of the lid structure 150, before the installation of the lid structure 150, in accordance with some embodiments.

The adhesive layer 132' may have a better adhering ability and a lower thermal conductivity than the TIM layer 140. For example, the adhesive layer 132' may have a thermal conductivity lower than about 0.5 W/m·K, and the TIM layer 140 may have a thermal conductivity higher than about 50 W/m·K. The TIM layer 140 with better thermal conductivity helps heat dissipation of the high-power consuming semiconductor die 110. In some embodiments, the TIM layer 140 may be made of or include a high thermal conductivity material such as a metallic-based material or a solder-based material comprising Cu, Ag, indium paste, or the like.

The TIM layer 140 may be a discontinuous structure, and has openings 142 for exposing the second semiconductor dies 112, as shown in FIG. 1F and FIG. 3B, in accordance with some embodiments. In some embodiments, the TIM layer 140 is formed over the semiconductor dies 110 and 112 and the encapsulant layer 116 as shown in FIG. 1F, and the openings 142 are aligned with the respective second semiconductor dies 112 to expose the second semiconductor dies 112. In the top view, each opening 142 may surround the corresponding second semiconductor die 112. The positions of openings 142 may correspond to the positions of openings 152 of the lid structure 150. In some embodiments, the openings 142 and 152 may have corresponding cross-sectional shapes, such as square or rectangular, depending on the shape of the second semiconductor dies 112, and corresponding cross-sectional areas, as shown in FIG. 1F and FIG. 3B, but the disclosure is not limited thereto.

In some alternative embodiments, the TIM layer 140 may be a continuous structure (i.e., no openings formed therein), and is dispensed only over the first semiconductor die 110 and does not extend over the second semiconductor dies 112 and the encapsulant layer 116. For example, in some embodiments shown in FIG. 1F-1, the TIM layer 140 has the shape and size (i.e., cross-sectional area) corresponding to the first semiconductor die 110, and does not cover (i.e., extend over) the second semiconductor dies 112 and the encapsulant layer 116 when it is arranged above the first semiconductor die 110.

Figure 4:
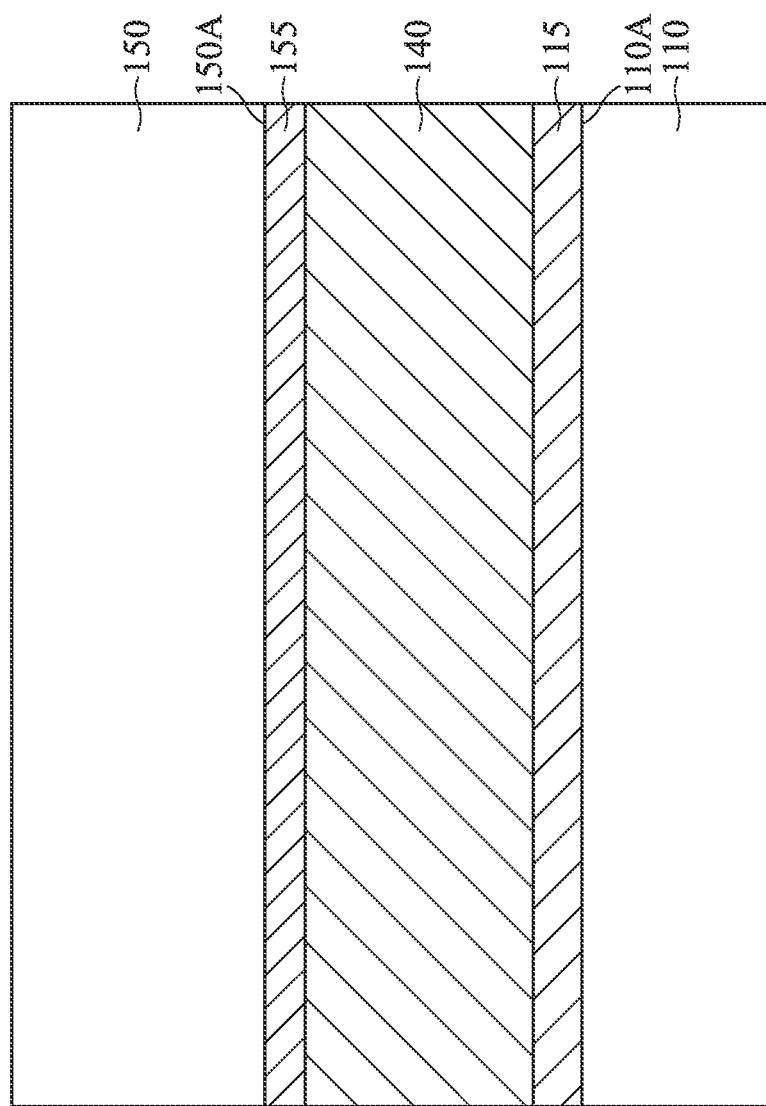
FIG. 4 is a closed-up cross-sectional view of a thermal stack in accordance with some embodiments.

While not shown in the cross-section of FIG. 1F (or FIG. 1F-1), it should be understood that various interfacial layers may be present between the first semiconductor die 110 and the TIM layer 140, between the lid structure 150 and the TIM layer 140, as well as possibly coating layers on the TIM layer 140. For example, referring to FIG. 4, which is a closed-up cross-sectional view of a thermal stack in accordance with some embodiments. As shown in FIG. 4, there is a metallization layer 115 additionally formed on the backside (i.e. the upper surface 110A) of the first semiconductor die 110. In some embodiments, the (backside) metallization layer 115 is Ni—Cu layer, and may be co-deposited on the first semiconductor die 110 backside using, for example, a physical vapor deposition (PVD) (this step is also known in the art as the "backside metallization (BSM)" process), although other suitable metallic materials and processes may also be used in different embodiments.

In turn, the TIM layer 140, which may be In—Sn layer or In—Sn—Cu layer in some embodiments, may be applied over the metallization layer 115 using, for example, a PVD process or the like. One skilled in the art would appreciate that the TIM layer 140 may use other suitable metallic materials and/or may further have metallic coatings formed thereon in different embodiments. Through the (backside) metallization layer 115 (interposed between and in contact with the first semiconductor die 110 and the TIM layer 140), the TIM layer 140 establishes a metallurgical bond with the first semiconductor die 110. For example, the above materials of components may combine to form a combination of materials having an inter-metallic structure, i.e., inter-metallic compound (IMC) layers. Such an inter-metallic structure has high thermal conductivity, and thus helps to dissipate heat generated from the high-power consuming semiconductor die 110.

In turn, the lid structure 150, which may be made of or include Cu (although other suitable metallic material may also be used, as mentioned above), may be adapted to the TIM layer 140. It should be noted that the lid structure 150 may also have a plating layer 155 on its bottom surface 150A, and the plating layer 155 may be Ni—Cu layer in some embodiments, although other suitable metallic materials may be used in different embodiments. In this way, an inter-metallic structure may also be formed between the lid structure 150 and the TIM layer 140, thereby helping to dissipate heat generated from the high-power consuming semiconductor die 110.

The formed thermal stack shown in FIG. 4 may be realized by performing a bonding process. Such a bonding process may be performed in an oxygen-free environment such as a nitrogen ($N_2$) environment. The bonding process may occur between approximately 150 degree Celsius (□) and 210 □, for a time period between several minutes to approximately 1 hour.

Figure 1G:
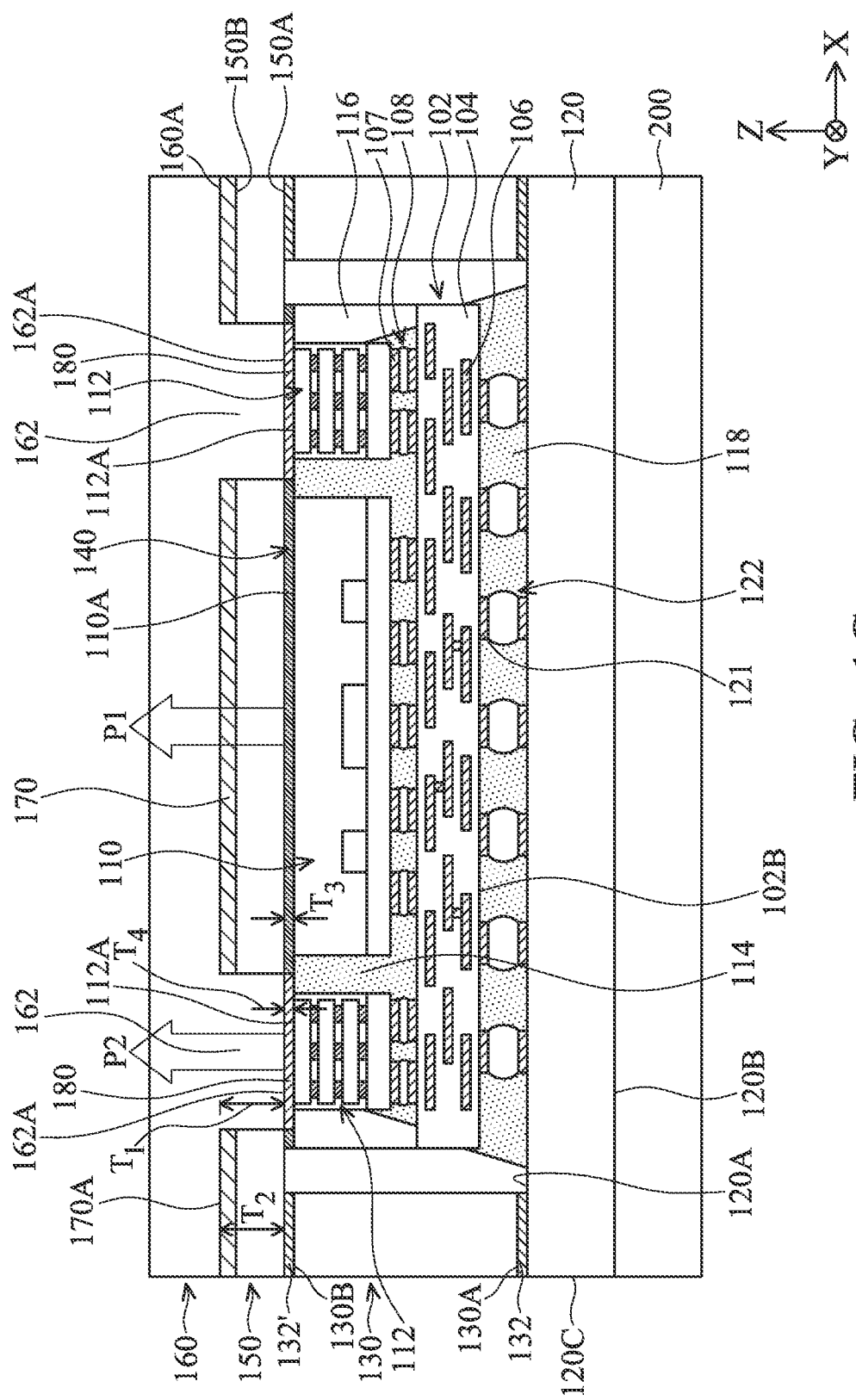

Next, referring to FIG. 1G, which shows a heat sink 160 (sometimes also called a heat spreader) being arranged above the lid structure 150 to increase heat dissipation, in accordance with some embodiments. The heat sink 160 may be placed over the lid structure 150 using, for example, a pick-and-place tool. The heat sink 160 may also have a high thermal conductivity, for example, between about 200 W/m·K to about 400 W/m·K or more, and may be formed of substantially similar materials as the lid structure 150 (but the disclosure is not limited thereto). In some embodiments, the heat sink 160 further includes a cooling structure formed on the top thereof, such as cooling fins 163 (see FIGS. 3A-3B).

As shown in FIGS. 1G, 3A, and 3B, the heat sink 160 has a bottom surface 160A and multiple protrusions 162 (the number of the protrusions 162 may be determined by the number of the second semiconductor dies 112) extending from the bottom surface 160A, in accordance with some embodiments. After being installed on the lid structure 150, the bottom surface 160A of the heat sink 160 is located over and faces the (top) surface 150B of the lid structure 150, and the protrusions 162 of the heat sink 160 can extend into the openings 152 of the lid structure 150 (and the openings 142 of the TIM layer 140, if they exist). The openings 152 of the lid structure 150 and/or the openings 142 of the TIM layer 140 are configured to allow the protrusions 162 of the heat sink 160 to pass through. In some embodiments, the protrusions 162 has the cross-sectional shape (e.g., square or rectangular) corresponding to the cross-sectional shape (e.g., square or rectangular) of the openings 152 and/or the openings 142, as shown in FIG. 3B, but the disclosure is not limited thereto.

As shown in FIG. 1G, the bottom surface 160A of the main portion (or base portion) 161 of the heat sink 160 is attached to the top surface 150B of the lid structure 150 using a TIM layer 170, in accordance with some embodiments. Accordingly, the heat generated from the first semiconductor die 110 can be dissipated through a heat path (from the TIM layer 140 to the lid structure 150, to the TIM layer 170, and to the heat sink 160) indicated by the arrow $P_1$.

The TIM layer 170 may have a good thermal conductivity (Tk), which may be between about 3 W/m·K to about 5 W/m·K. In some embodiments, the TIM layer 170 is made of or include a polymer with thermal conductive fillers. Applicable thermal conductive fillers materials may include aluminum oxide, boron nitride, aluminum nitride, aluminum, copper, silver, the like, or a combination thereof. In some embodiments, the TIM layer 170 utilizes a gel or film type polymer TIM. The TIM layer 170 may be applied to the bottom surface 160A of the heat sink 160 (main portion) or may be applied over the (top) surface 150B of the lid structure 150, before the installation of the heat sink 160, in accordance with some embodiments.

In some embodiments, the TIM layer 170 further has openings 172 (see FIG. 3B) through which the protrusions 162 of the heat sink 160 can extend into the openings 152 (see FIG. 1F) of the lid structure 150. The openings 172 may be aligned with the openings 152 of the lid structure 150 (and the openings 142 of the TIM layer 140, if they exist). In some embodiments, the cross-sectional shape (e.g., square or rectangular) of the openings 172 corresponds to the cross-sectional shape (e.g., square or rectangular) of openings 152 (and the openings 142, if they exist), as shown in FIG. 3B, but the disclosure is not limited thereto.

Figure 1H:
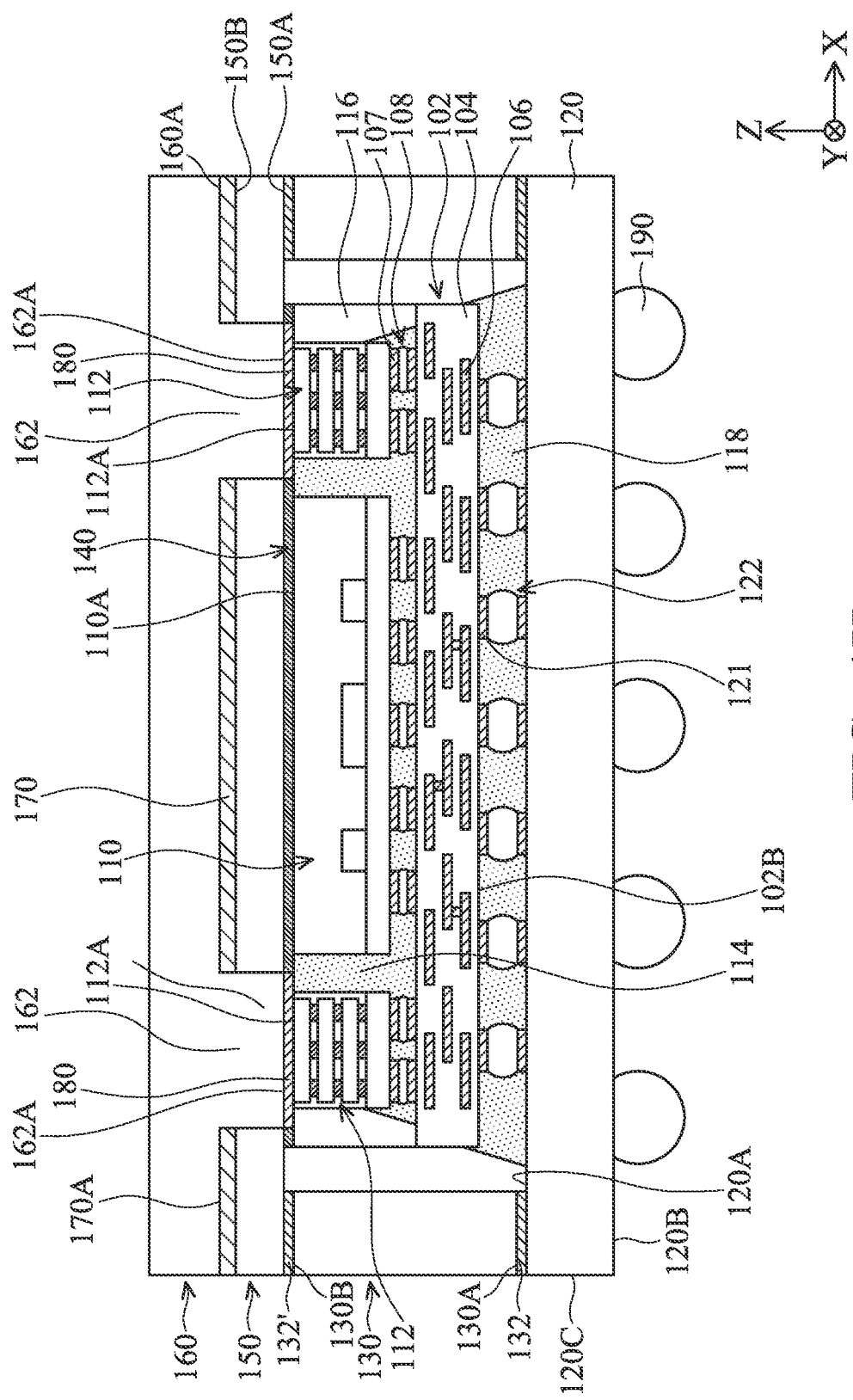
Figures 1, 1H:
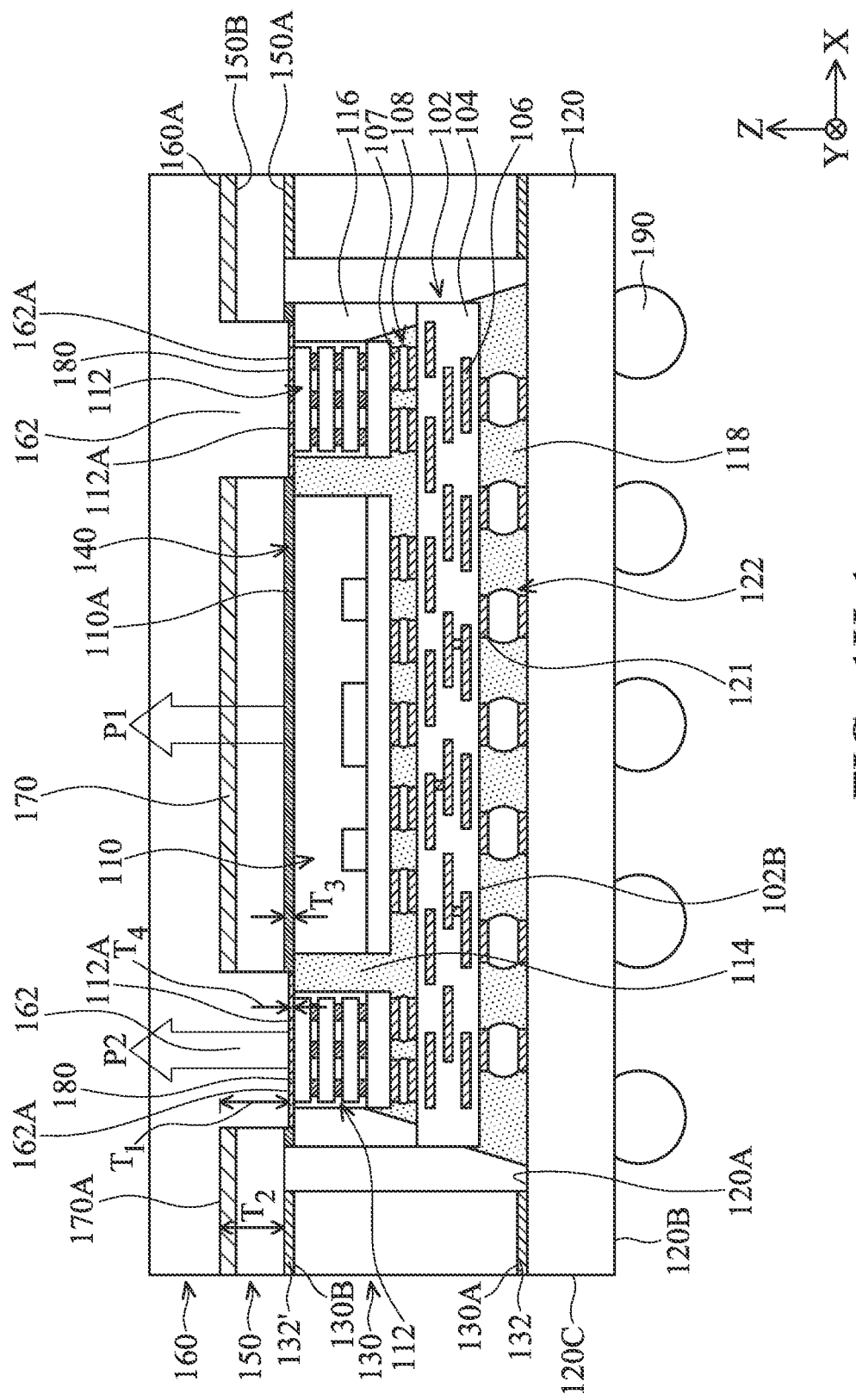
Figure 2:
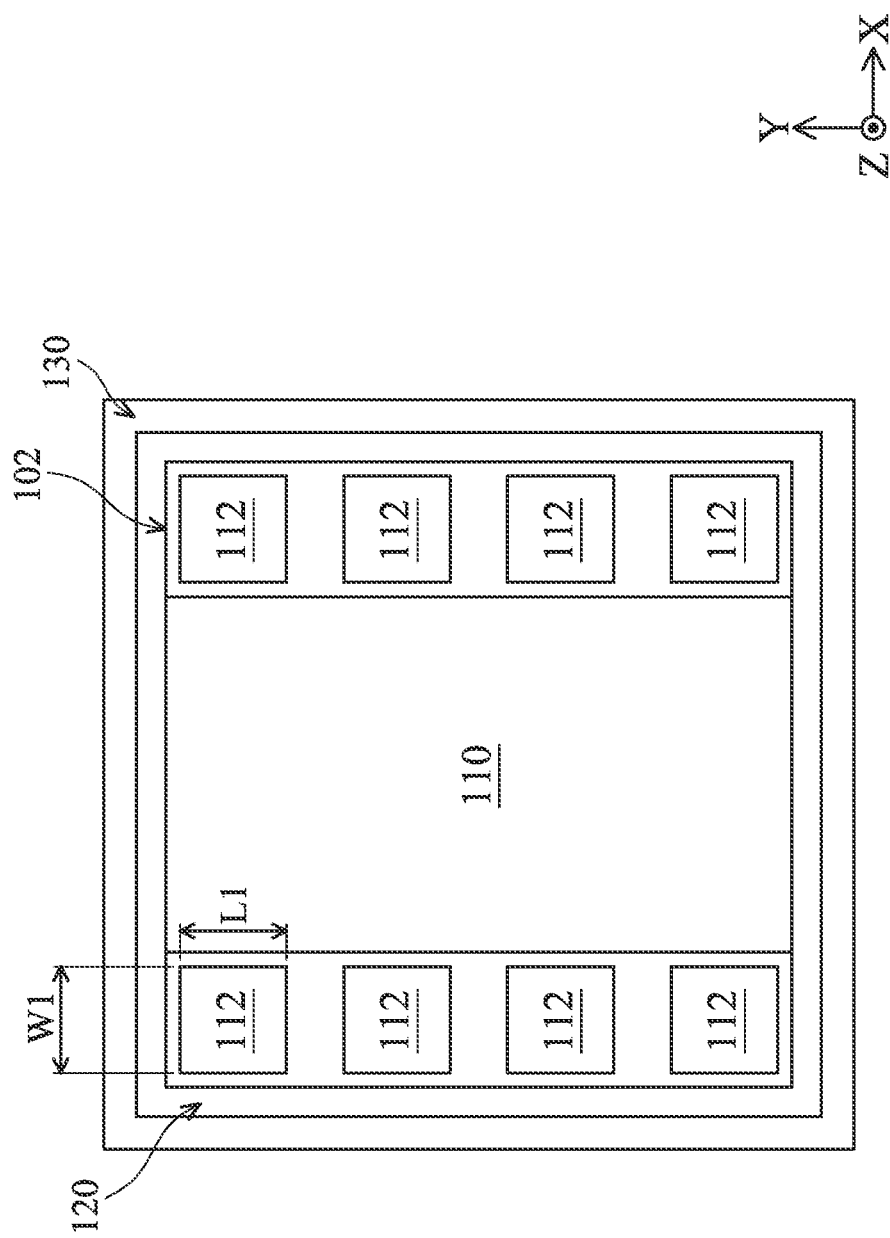

After the installation of the heat sink 160, the bottom surface 162A of the protrusions 162 and the bottom surface 150A of the lid structure 150 may be substantially at the same height as shown in FIG. 1G and FIG. 3A, but the disclosure is not limited thereto. In some alternative embodiments, the bottom surface 162A of the protrusions 162 may also be lower than (i.e., extends beyond) the bottom surface 150A of the lid structure 150, as shown in FIG. 1H-1. Thus, the thickness $T_1$ of each protrusion 162 (i.e., the distance from the bottom surface 160A of the heat sink to the bottom surface 162A of the protrusion 162) in the vertical direction Z may be equal to or greater than the combined thickness $T_2$ of the TIM layer 170 and the lid structure 150 (i.e., the distance from the upper surface 170A of the TIM layer 170 to the bottom surface 150A of the lid structure 150) in the vertical direction Z, in various embodiments.

As shown in FIG. 1G, the bottom surface 162A of each protrusion 162 is attached to the top surface 112A of the corresponding second semiconductor die 112 using a TIM layer 180. Accordingly, the heat generated from the second semiconductor die(s) 112 can be dissipated through another heat path (from the TIM layer 180 to the heat sink 160) indicated by the arrow $P_2$. As the heat path $P_2$ does not pass through a number of interfaces (like the interfaces between the lid structure 150 and the TIM layers 140 and 170), it reduces the contact thermal resistance from layer to layer. As a result, the heat transfer of the second semiconductor dies 112, as well as the thermal performance of the entire package structure, can be improved.

In some embodiments, the TIM layer 180 may have a good thermal conductivity (Tk), which may be between about 3 W/m·K to about 5 W/m·K, and may use the same or similar polymer material as the TIM layer 170. In some embodiments, the TIM layer 180 utilizes a gel or film type polymer TIM. The TIM layer 180 may be applied to the top surface 112A of the corresponding second semiconductor die 112 or may be applied over the bottom surface 162A of the corresponding protrusion 162, before the installation of the heat sink 160, in accordance with some embodiments.

It should be understood that because each second semiconductor die 112 (low-power consuming die) generates a relative small amount of heat, compared to the first semiconductor die 110 (high-power consuming die), the TIM layer 180 having a thermal conductivity lower than that of the TIM layer 140 (in contact with the first semiconductor die 110) can still effectively dissipate heat from the second semiconductor die 112. In addition, the TIM layer 180 using polymer TIM (instead of metallic-based or solder-based TIM) can not only reduce the quantity of the TIM layer 140 (e.g., solder TIM, which is more expensive) but also save (i.e., omit) the backside metallization (BSM) process performed on the second semiconductor die 112, thereby reducing cost. Furthermore, because polymer TIM (whether it is a gel or film type polymer TIM) typically has a better adhering ability than metallic-based or solder-based TIM, it also reduces the risk of TIM delamination (e.g., caused by substrate warpage) during thermal cycling.

In some embodiments where the TIM layer 140 has openings 142 to expose the second semiconductor dies 112, the TIM layers 180 are located within the openings 142 and in contact with the second semiconductor dies 112, as shown in FIG. 1G and FIG. 3B. The openings 142 of the TIM layer 140 may surround the TIM layers 180. In some embodiments, the TIM layers 180 are spaced apart from the TIM layer 140 (see FIG. 1G, for example) so as reduce thermal crosstalk between the semiconductor dies 110 and 112.

In some embodiments, the thickness $T_4$ of the TIM layers 180 in the vertical direction Z may be equal to or less than the thickness $T_3$ of the TIM layer 140 in the vertical direction Z, as shown in FIG. 1G and FIG. 1H-1. Note that because the TIM layer 180 has a relatively low thermal conductivity, it should have a small thickness to increase heat transfer. In some embodiments, the thickness $T_5$ (see FIG. 3B) of each cooling fin 163 of the heat sink 160 is large enough to increase heat dissipation, for example, may be larger than the combined thickness of the TIM layer 170, the lid structure 150, and the TIM layer 140 (or TIM layer 180) (i.e., $T_5 > T_2 + T_4$ or $T_5 > T_4 + T_3$).

In some embodiments, the cross-sectional area of each TIM layer 180 corresponds to (e.g., equal to) the cross-sectional area of the bottom surface 162A of the corresponding protrusion 162 of the heat sink 160. For example, the TIM layer 180 may cover substantially the entire bottom surface 162A of the corresponding protrusion 162. Also, the cross-sectional area of the bottom surface 162A of the each protrusion 162 is equal to or greater than the cross-sectional area of the upper surface 112A of the corresponding second semiconductor die 112, in accordance with some embodiments. For example, each second semiconductor die 112 has a width $W_1$ and a length $L_1$ in cross section (see FIG. 2), and the bottom surface 162A of the each protrusion 162 has a width $W_2$ and a length $L_2$ in cross section (see FIG. 3B). The width $W_2$ may be equal to or greater than the width $W_1$, and the length $L_2$ may be equal to or greater than length $L_1$. This (large contact area) helps the semiconductor dies 112 to quickly dissipate heat.

Many variations and/or modifications can be made to embodiments of the disclosure. For example, although in the above embodiments the protrusions 162 of the heat sink 160 (as well as the TIM layers 180) and the second semiconductor dies 112 are in a one-to-one configuration, the disclosure is not limited thereto.

FIGS. 5A and 5B are respectively a cross-sectional view and an exploded view of a portion (the thermal management feature as discussed above) of another semiconductor die package in accordance with some other embodiments. In the embodiments of FIGS. 5A-5B, each protrusion 162 of the heat sink 160 (and each TIM layer 180) is configured to correspond to two second semiconductor dies 112 (see FIG. 2) on one side of the first semiconductor die 110 and arranged in a linear direction (e.g., the direction Y shown in FIG. 2). The length of each protrusion 162 (and each TIM layer 180) in the direction Y may be equal to or greater than the combined length of the corresponding two second semiconductor dies 112 in the direction Y so as to improve heat dissipation. Also, the configuration of the openings of TIM layer 170, lid structure 150, and TIM layer 140 are changed accordingly.

FIGS. 6A and 6B are respectively a cross-sectional view and an exploded view of a portion (the thermal management feature as discussed above) of yet another semiconductor die package in accordance with some other embodiments. In the embodiments of FIGS. 6A-6B, each protrusion 162 of the heat sink 160 (and each TIM layer 180) is configured to correspond to four second semiconductor dies 112 (see FIG. 2) on one side of the first semiconductor die 110 and arranged in the direction Y. Similarly, the length of each protrusion 162 (and each TIM layer 180) in the direction Y may be equal to or greater than the combined length of the corresponding four second semiconductor dies 112 in the direction Y so as to improve heat dissipation. Also, the configuration of the openings of TIM layer 170, lid structure 150, and TIM layer 140 are changed accordingly.

One of ordinary skill in the art will appreciate that the above arrangement examples of the thermal management feature are provided for illustrative purposes, and other suitable arrangements may also be used.

Next, referring to FIG. 1H. As shown in FIG. 1H, the carrier substrate 200 (in FIG. 1G) is removed to expose a second surface 120B (e.g., the shown lower surface) of the package substrate 120, after the installation of the heat sink 160, in accordance with some embodiments. Conductive bumps 190 are then formed over the second surface 120B that is originally covered by the carrier substrate 200. Each conductive bump 190 may be electrically connected to one of the exposed contact pads (not shown) of the package substrate 120. The conductive bumps 190 enable electrical connection between the package structure and an external electronic device such as a PCB (not shown). The conductive bumps 190 may be or include solder bumps such as tin-containing solder bumps. The tin-containing solder bumps may further include copper, silver, gold, aluminum, lead, one or more other suitable materials, or a combination thereof. In some embodiments, the tin-containing solder bump is lead-free.

In some embodiments, solder balls (or solder elements) are disposed on the exposed contact pads of the second surface 120B after the removal of the carrier substrate 200. A reflow process is then carried out to melt the solder balls into the conductive bumps 190. In some other embodiments, under bump metallization (UBM) elements are formed over the exposed contact pads before the solder balls are disposed. In some other embodiments, solder elements are electroplated onto the exposed contact pads. Afterwards, a reflow process is used to melt the solder element to form the conductive bumps 190.

As a result, the process for forming the resulting semiconductor die package illustrated in FIG. 1H is completed.

Figure 7:
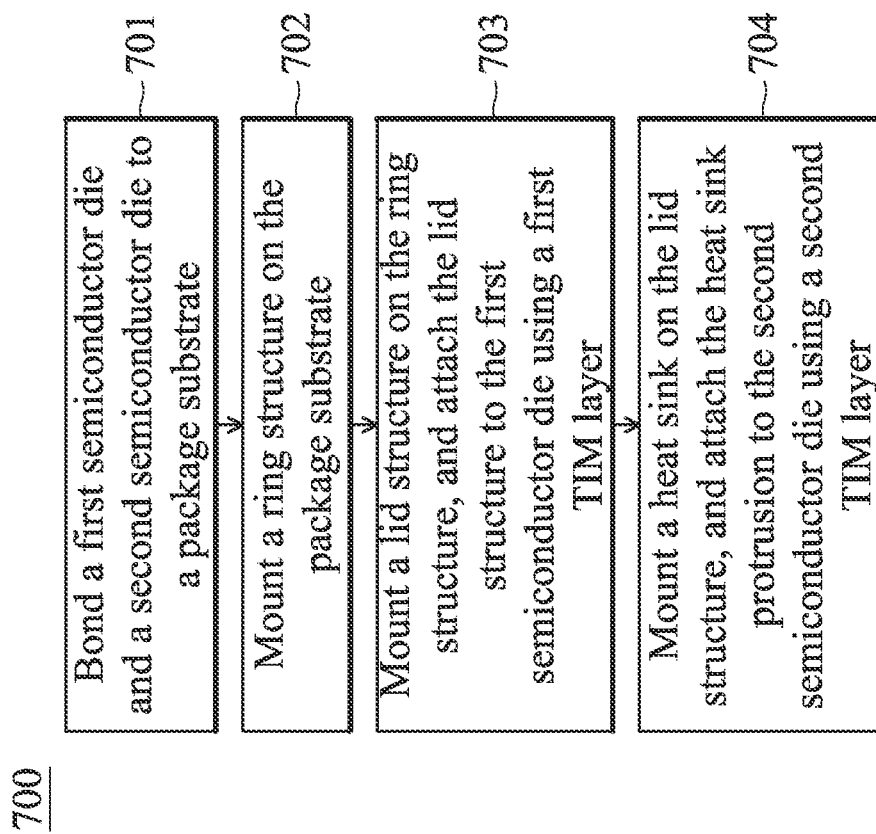
FIG. 7 is a simplified flowchart illustrating a method for forming a semiconductor die package in accordance with some embodiments.

FIG. 7 is a simplified flowchart illustrating a process flow 700 for forming a semiconductor die package in accordance with some embodiments. For illustration, the flowchart will be described along with the drawings shown in FIGS. 1D-1G. Some of the described operations can be replaced or eliminated in different embodiments. Alternatively, some operations may be added in different embodiments.

The process flow 700 includes operation 701, in which a first semiconductor die (e.g., a high-power consuming die) 110 and a second semiconductor die (e.g., a low-power consuming die) 112 is bonded to a package substrate 120, as illustrated in FIG. 1D. The process flow 700 also includes operation 702, in which a ring structure 130 is mounted on the package substrate 120 to surround the first and second semiconductor dies 110 and 112, as illustrated in FIG. 1E. The process flow 700 also includes operation 703, in which a lid structure 150 is mounted on the ring structure 130 and above the first and second semiconductor dies 110 and 112, as illustrated in FIG. 1F. In some alternative embodiments, the lid structure 150 and the ring structure 130 are integrally formed structure (i.e., an one-piece structure), and such an one-piece structure is attached to the package substrate 120 in a single step using the adhesive layer 132, as shown in FIG. 1F-2.

The operation 703 further includes attaching the lid structure 150 to the first semiconductor die 110 using a first thermal interface material (TIM) layer 140 interposed between the bottom surface 150A of the lid structure 150 and the upper surface 110A of the first semiconductor die 110, as illustrated in FIG. 1F (or FIG. 1F-1 or FIG. 1F-2). In some embodiments, the material of first TIM layer 140 includes a metallic-based material or a solder-based material. In this case, the process flow 700 may further include an operation of providing a metallization layer 115 (see FIG. 4) on the upper surface 110A of the first semiconductor die 110 before forming the first TIM layer 140 on the upper surface (i.e., backside) 110A of the first semiconductor die 110. The (backside) metallization layer 115 is used to help the first TIM layer 140 and the first semiconductor die 110 to establish a metallurgical bond (through a bonding process as described above), which helps to dissipate heat generated from the first semiconductor die 110.

The process flow 700 also includes operation 704, in which a heat sink 160 is mounted on the lid structure 150, as illustrated in FIG. 1G. In some embodiments, the heat sink 160 is attached to the top surface 150B of the lid structure 150 using another TIM layer 170, which may be polymer TIM and may have a thermal conductivity lower than that of the first TIM layer 140. In some embodiments, the heat sink 160 has a protrusion 162 extending from its bottom surface 160A, and the protrusion 162 can extend into the opening 152 of the lid structure 150 after the installation of the heat sink 160. In some embodiments, the first TIM layer 140 may have openings 142 (see FIG. 1F and FIG. 3B) and/or the TIM layer 170 may have openings 172 (see FIG. 3B) to allow the protrusion 162 of the heat sink 160 to pass through.

Additionally, the operation 704 further includes attaching the protrusion 162 of the heat sink 160 to the second semiconductor die 112 using a second TIM layer 180 interposed between the bottom surface 162A of the protrusion 162 and the upper surface 112A of the second semiconductor die 112, as illustrated in FIG. 1G. In some embodiments, the second TIM layer 180 may also be polymer TIM and may have a thermal conductivity lower than that of the first TIM layer 140. The second TIM layer 180 may use the same or similar material as the TIM layer 170. In some embodiments, the second TIM layer 180 is provided on the bottom surface 162A of the protrusion 162 or provided on the upper surface 112A of the second semiconductor die 112, before the mounting of the heat sink (operation 704). In some embodiments, the first TIM layer 140 and the second TIM layer 180 are provided in such a way that the second TIM layer 180 is spaced apart from the first TIM layer 140.

As mentioned above, a semiconductor die package and the method for forming the same are provided in accordance with some embodiments of the disclosure. In the package structure, the heat sink has protrusions extending into the openings of the lid structure, and the heat sink protrusions are attached to the second semiconductor dies (low-power consuming dies) using TIM layers. This helps to improve the heat transfer of the second semiconductor dies by reducing the contact thermal resistance from layer to layer. In some embodiments, the TIM layers in contact with the second semiconductor dies may utilize polymer TIM instead of expensive metallic-based or solder-based TIM, and the BSM process performed on the second semiconductor dies can thus be omitted, thereby reducing cost. In addition, because polymer TIM typically has a better adhering ability than metallic-based or solder-based TIM, it also reduces the risk of TIM delamination during thermal cycling. As a result, the reliability of the entire package is improved.

In accordance with some embodiments, a semiconductor die package is provided. The semiconductor die package includes a package substrate, a semiconductor device, a ring structure, a lid structure, a heat sink, a first thermal interface material (TIM) layer, and a second TIM layer. The package substrate has a first surface. The semiconductor device is disposed over the first surface of the package substrate. The ring structure is attached to the first surface of the package substrate and surrounds the semiconductor device. The lid structure is attached to the ring structure and disposed over the semiconductor device. The lid structure also has a first opening exposing the a first part of the semiconductor device. The heat sink is disposed over the lid structure and has a first portion and a second portion. The first portion of the heat sink is attached to the upper surface of the lid structure. The second portion of the heat sink extends into the first opening of the lid structure and is attached to the upper surface of the first part of the semiconductor device. The first TIM layer is interposed between the bottom surface of the lid structure and the upper surface of a second part of the semiconductor device. The second TIM layer is interposed between the bottom surface of the second portion of the heat sink and the upper surface of the first part of the semiconductor device. The first TIM layer has a thermal conductivity higher than the thermal conductivity of the second TIM layer.

In accordance with some embodiments, a semiconductor die package is provided. The semiconductor die package includes a package substrate, a first semiconductor die, a second semiconductor die, a ring structure, a lid structure, a heat sink, a first TIM layer, and a second TIM layer. The package substrate has a first surface. The first and second semiconductor dies are disposed over the first surface of the package substrate, and the power consumption of the first semiconductor die is greater than the power consumption of the second semiconductor die. The ring structure is attached to the first surface of the package substrate and surrounds the first and second semiconductor dies. The lid structure is attached to the ring structure and disposed over the first and second semiconductor dies. The lid structure also has a first opening exposing the second semiconductor die. The heat sink is disposed over the lid structure. The heat sink has a bottom surface facing the upper surface of the lid structure, and a protrusion extending from the bottom surface into the first opening of the lid structure. The first TIM layer is interposed between the bottom surface of the lid structure and the upper surface of the first semiconductor die. The second TIM layer is interposed between the bottom surface of the protrusion of the heat sink and the upper surface of the second semiconductor die. The first TIM layer has a thermal conductivity higher than the thermal conductivity of the second TIM layer.

In accordance with some embodiments, a method for forming a semiconductor die package is provided. The method includes bonding a first semiconductor die and a second semiconductor die to a first surface of a package substrate. The method also includes mounting a ring structure on the first surface of the package substrate to surround the first and second semiconductor dies. The method also includes mounting a lid structure on the ring structure and above the first and second semiconductor dies, wherein the lid structure has a first opening exposing the second semiconductor die. The method also includes attaching the lid structure to the first semiconductor die using a first TIM layer interposed between the bottom surface of the lid structure and the upper surface of the first semiconductor die. The method further includes mounting a heat sink on the lid structure, wherein the heat sink has a first portion located over the upper surface of the lid structure, and a second portion extending into the first opening of the lid structure. In addition, the method includes attaching the second portion of the heat sink to the second semiconductor die using a second TIM layer interposed between the bottom surface of the second portion of the heat sink and the upper surface of the second semiconductor die. The first TIM layer has a thermal conductivity higher than the thermal conductivity of the second TIM layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor die package, comprising:
    bonding a first semiconductor die and a second semiconductor die to a first surface of a package substrate;
    mounting a ring structure on the first surface of the package substrate to surround the first and second semiconductor dies;
    mounting a lid structure on the ring structure and above the first and second semiconductor dies, wherein the lid structure has a first opening exposing the second semiconductor die;
    attaching the lid structure to the first semiconductor die using a first thermal interface material (TIM) layer interposed between a bottom surface of the lid structure and an upper surface of the first semiconductor die;
    mounting a heat sink on the lid structure, wherein the heat sink has a first portion located over an upper surface of the lid structure, and a second portion extending into the first opening of the lid structure; and
    attaching the second portion of the heat sink to the second semiconductor die using a second TIM layer interposed between a bottom surface of the second portion of the heat sink and an upper surface of the second semiconductor die, wherein the first TIM layer has a thermal conductivity higher than a thermal conductivity of the second TIM layer.

2. The method as claimed in claim 1, wherein the first TIM layer comprises a metallic-based material or a solder-based material, and the second TIM layer comprises a polymer with thermal conductive fillers, and
    wherein the method further comprises:
    providing a metallization layer on the upper surface of the first semiconductor die before forming the first TIM layer on the upper surface of the first semiconductor die, wherein the metallization layer is used to help the first TIM layer and the first semiconductor die to establish a metallurgical bond.

3. The method as claimed in claim 1, wherein the second TIM layer is formed on the bottom surface of the second portion of the heat sink before the mounting of the heat sink.

4. The method as claimed in claim 1, further comprising:
    providing a third TIM layer between a bottom surface of the first portion of the heat sink and the upper surface of the lid structure, wherein the third TIM layer has a second opening to allow the second portion of the heat sink to pass through.

5. The method as claimed in claim 1, wherein the first TIM layer and the second TIM layer are provided in such a way that the second TIM layer is spaced apart from the first TIM layer.

6. The method as claimed in claim 1, wherein the first TIM layer is disposed over the first and second semiconductor dies and having a second opening exposing the second semiconductor die, and the second opening of the first TIM layer surrounds the second TIM layer.

7. The method as claimed in claim 6, further comprising:
providing a third TIM layer between a bottom surface of the first portion of the heat sink and the upper surface of the lid structure, wherein the third TIM layer has a third opening through which the second portion of the heat sink extends into the first opening of the lid structure.

8. The method as claimed in claim 1, wherein a thickness of the second TIM layer in a vertical direction is equal to or less than a thickness of the first TIM layer in the vertical direction.

9. The method as claimed in claim 1, wherein a cross-sectional area of the second TIM layer corresponds to a cross-sectional area of the bottom surface of the second portion of the heat sink, and
the cross-sectional area of the bottom surface of the second portion of the heat sink is equal to or greater than a cross-sectional area of the upper surface of second semiconductor die.

10. The method as claimed in claim 1, wherein a power consumption of the first semiconductor die is greater than a power consumption of the second semiconductor die.

11. A method for forming a semiconductor die package, comprising:
disposing a semiconductor device over a first surface of a package substrate;
mounting a ring structure on the first surface of the package substrate to surround the semiconductor device;
mounting a lid structure on the ring structure and above the semiconductor device, wherein the lid structure has a first opening exposing a first part of the semiconductor device;
attaching the lid structure to a second part of the semiconductor device using a first thermal interface material (TIM) layer interposed between a bottom surface of the lid structure and an upper surface of the second part of the semiconductor device;
mounting a heat sink on the lid structure, wherein the heat sink has a first portion located over an upper surface of the lid structure, and a second portion extending into the first opening of the lid structure; and
attaching the second portion of the heat sink to the first part of the semiconductor device using a second TIM layer interposed between a bottom surface of the second portion of the heat sink and an upper surface of the first part of the semiconductor device, wherein the first TIM layer has a thermal conductivity higher than a thermal conductivity of the second TIM layer.

12. The method as claimed in claim 11, wherein the first TIM layer comprises a metallic-based material or a solder-based material, and the method further comprises:
forming a metallization layer on the upper surface of the second part of the semiconductor device disposing the first TIM layer on the upper surface of the second part of the semiconductor device,
wherein the first TIM layer establishes a metallurgical bond with the second part of the semiconductor device through the metallization layer.

13. The method as claimed in claim 11, wherein the second TIM layer comprises a polymer with thermal conductive fillers.

14. The method as claimed in claim 11, wherein the first TIM layer is disposed over the semiconductor device and having a second opening exposing the first part of the semiconductor device, and the second opening of the first TIM layer surrounds the second TIM layer.

15. The method as claimed in claim 14, wherein the second TIM layer is spaced apart from the first TIM layer.

16. The method as claimed in claim 11, wherein a thickness of the second TIM layer in a vertical direction is less than a thickness of the first TIM layer in the vertical direction.

17. The method as claimed in claim 11, wherein the semiconductor device further has a plurality of first parts arranged in a first direction,
wherein the first opening of the lid extends in the first direction and exposes the plurality of first parts, and
wherein the second portion of the heat sink extends in the first direction and is attached to upper surfaces of the plurality of first parts through the second TIM layer that extends in the first direction and across the first parts.

18. A method for forming a semiconductor die package, comprising:
bonding a first semiconductor die and a second semiconductor die to a first surface of a package substrate, wherein a power consumption of the first semiconductor die is greater than a power consumption of the second semiconductor die;
mounting a ring structure on the first surface of the package substrate to surround the first and second semiconductor dies;
mounting a lid structure on the ring structure and above the first and second semiconductor dies, wherein the lid structure has a first opening exposing the second semiconductor die, and attaching the lid structure to the first semiconductor die using a first thermal interface material (TIM) layer interposed between a bottom surface of the lid structure and an upper surface of the first semiconductor die; and
mounting a heat sink on the lid structure, wherein the heat sink has a first portion located over an upper surface of the lid structure and a second portion extending into the first opening of the lid structure, and attaching the second portion of the heat sink to the second semiconductor die using a second TIM layer interposed between a bottom surface of the second portion of the heat sink and an upper surface of the second semiconductor die, wherein the first TIM layer comprises a metallic-based material or a solder-based material and the second TIM layer comprises a polymer with thermal conductive fillers, and wherein the second TIM layer is spaced apart from the first TIM layer.

19. The method as claimed in claim 18, wherein the first TIM layer is a discontinuous structure and has a second opening exposing the second semiconductor die, and the second opening of the first TIM layer surrounds the second TIM layer.

20. The method as claimed in claim 18, further comprising:
providing a metallization layer on the upper surface of the first semiconductor die before forming the first TIM layer on the upper surface of the first semiconductor die, wherein the metallization layer is used to help the first TIM layer and the first semiconductor die to establish a metallurgical bond.

\* \* \* \* \*